US006957405B2

(12) United States Patent
Saunders et al.

(10) Patent No.: US 6,957,405 B2
(45) Date of Patent: *Oct. 18, 2005

(54) METHODS FOR MANUFACTURING AN ELECTRONIC DEVICE HAVING AN ELECTRONICALLY DETERMINED PHYSICAL TEST MEMBER

(75) Inventors: J. Lynn Saunders, Hillsboro, OR (US); Alan R. Loudermilk, Chicago, IL (US)

(73) Assignee: Microconnect LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/641,567

(22) Filed: Aug. 14, 2003

(65) Prior Publication Data

US 2004/0034839 A1 Feb. 19, 2004

Related U.S. Application Data

(63) Continuation of application No. 10/041,866, filed on Jan. 7, 2002, now Pat. No. 6,622,289, which is a continuation of application No. 09/154,410, filed on Sep. 15, 1998, now Pat. No. 6,343,369.

(51) Int. Cl.[7] ................................................ G06F 17/50
(52) U.S. Cl. .................................... 716/4; 716/5; 716/6
(58) Field of Search ................................ 716/1–6, 7, 8, 716/9–19; 324/725, 754, 757, 761, 762, 768; 723/72.5, 754, 757, 761, 762, 768

(56) References Cited

U.S. PATENT DOCUMENTS 3,405,361 A 10/1968 Kattner et al. .............. 324/158
3,810,016 A 5/1974 Chayka et al. ........... 324/158 P
3,832,632 A 8/1974 Ardezzone .............. 324/158 P
3,851,249 A 11/1974 Roch .......................... 325/754
3,866,119 A 2/1975 Ardezzone et al. ...... 324/158 P
4,035,723 A 7/1977 Kvaternik ................... 324/754
4,161,692 A 7/1979 Tarzwell ................. 324/158 P
4,574,235 A 3/1986 Kelly et al. ............. 324/158 F
4,585,727 A 4/1986 Reams ........................ 430/312
4,588,241 A 5/1986 Ardezzone ............... 339/59 M
4,636,722 A 1/1987 Ardezzone .............. 324/158 P
4,673,839 A 6/1987 Veenendaal ................. 310/338

(Continued)

FOREIGN PATENT DOCUMENTS

EP 0220830 5/1987
EP 0230348 7/1987 ...................... 1/73
EP 0276900 8/1988 ...................... 5/25
EP 0283219 9/1988 ...................... 1/73
EP 0331282 9/1989 ...................... 1/73
EP 0360396 3/1990 .................... 31/28
EP 0361779 4/1990 ...................... 1/73
EP 0369554 5/1990 ...................... 1/73
JP 3165033 12/1992 ...................... 1/73

*Primary Examiner*—Vuthe Siek
*Assistant Examiner*—Binh Tat
(74) *Attorney, Agent, or Firm*—Loudermilk & Associates

(57) ABSTRACT

A method for manufacturing an electronic device such as an integrated circuit or display device is provided. A design description of the electronic device is generated using a computer aided design tool. Physical device data representing a physical description of the electronic device are electronically determined baded on the design description. The physical device data includes data defining connection points for connecting the electronic device to external circuits and data indentifying a plurality of connection points of the electronic device. A physical embodiment of the electronic device is produced in accordance with the physical device data. Physical test member data representing conductors and contact points of a test member for testing the electronic device are electronically determined. The test member is produced in accordance with the test member data and used to test the electronic device.

27 Claims, 21 Drawing Sheets

U.S. PATENT DOCUMENTS

| | | | | | |
|---|---|---|---|---|---|
| 4,697,143 | A | | 9/1987 | Lockwood et al. | 324/158 P |
| 4,749,942 | A | | 6/1988 | Sang et al. | 324/158 P |
| 4,751,457 | A | | 6/1988 | Veenendaal | 324/158 F |
| 4,758,785 | A | | 7/1988 | Rath | 324/158 P |
| 4,764,723 | A | | 8/1988 | Strid | 324/158 P |
| 4,829,233 | A | | 5/1989 | Flemming et al. | 324/58.5 |
| 4,829,242 | A | | 5/1989 | Carey et al. | 324/158 P |
| 4,891,585 | A | | 1/1990 | Janko et al. | 324/158 P |
| 4,894,612 | A | | 1/1990 | Drake et al. | 324/158 |
| 4,899,099 | A | | 2/1990 | Mendenhall et al. | 324/158 F |
| 4,904,933 | A | | 2/1990 | Snyder et al. | 324/158 F |
| 4,906,920 | A | | 3/1990 | Huff et al. | 324/158 P |
| 4,912,399 | A | | 3/1990 | Greub et al. | 324/158 P |
| 4,918,383 | A | | 4/1990 | Huff et al. | 324/158 P |
| 4,943,768 | A | | 7/1990 | Niki et al. | 324/158 F |
| 4,975,638 | A | | 12/1990 | Evans et al. | 324/158 P |
| 4,980,637 | A | | 12/1990 | Huff et al. | 324/158 P |
| 4,998,062 | A | | 3/1991 | Ikeda | 324/158 |
| 5,030,907 | A | | 7/1991 | Yih et al. | 324/754 |
| 5,053,850 | A | | 10/1991 | Baker et al. | 257/786 |
| 5,061,894 | A | | 10/1991 | Ikeda | 324/158 E |
| 5,191,708 | A | | 3/1993 | Kasukabe et al. | 29/846 |
| 5,198,755 | A | | 3/1993 | Ikeda et al. | 324/158 |
| 5,221,895 | A | | 6/1993 | Janko et al. | 324/762 |
| 5,355,080 | A | | 10/1994 | Sato et al. | 324/761 |
| 5,414,371 | A | | 5/1995 | Isaac | 324/762 |
| 5,416,429 | A | | 5/1995 | McQuade et al. | 324/762 |
| 5,489,855 | A | | 2/1996 | Poisel | 324/761 |
| 5,491,891 | A | | 2/1996 | Isaac | 29/842 |
| 5,506,515 | A | | 4/1996 | Godshalk et al. | 324/762 |
| 5,528,159 | A | | 6/1996 | Charlton et al. | 324/758 |
| 5,557,212 | A | | 9/1996 | Isaac et al. | 324/755 |
| 5,565,788 | A | | 10/1996 | Burr et al. | 324/762 |
| 5,621,333 | A | | 4/1997 | Long et al. | 324/762 |
| 5,724,248 | A | * | 3/1998 | Ehlig | 716/4 |
| 5,880,011 | A | | 3/1999 | Zablotny et al. | 438/462 |
| 6,046,599 | A | * | 4/2000 | Long et al. | 324/762 |
| 6,091,256 | A | | 7/2000 | Long et al. | 324/762 |
| 6,343,369 | B1 | * | 1/2002 | Saunders et al. | 716/4 |
| 6,496,026 | B1 | * | 12/2002 | Long et al. | 324/762 |
| 6,622,289 | B2 | * | 9/2003 | Saunders et al. | 716/4 |

* cited by examiner

| Tester Channel | Pad Name Or ID | Pad Data | Location (X,Y) |
|---|---|---|---|

470

METHODS FOR MANUFACTURING AN ELECTRONIC DEVICE HAVING AN ELECTRONICALLY DETERMINED PHYSICAL TEST MEMBER

This is a continuation of U.S. patent application Ser. No. 10/041,866, filed Jan. 7, 2002, now U.S. Pat. No. 6,622,289, which was a continuation of U.S. patent application Ser. No. 09/154,410, filed Sep. 15, 1998, now U.S. Pat. No. 6,343, 369.

BACKGROUND OF THE INVENTION

This invention relates to contact devices for making connection to an electronic circuit device and to methods of fabricating and using such a contact device, such as in the manufacture of semiconductor, liquid crystal displays or other devices, and improved contact devices.

An important aspect of the manufacture of integrated circuit chips is the testing of the circuit embodied in the chip in order to verify that it operates according to specifications. Although the circuit could be tested after the chip has been packaged, the expense involved in dicing the wafer and packaging the individual chips makes it preferable to test the circuit as early as possible in the fabrication process, so that unnecessary efforts will not be expended on faulty devices. It is therefore desirable that the circuits be tested either immediately after wafer fabrication is completed, and before separation into dice, or after dicing, but before packaging. In either case, it is necessary to make electrical connection to the circuits' external connection points (usually bonding pads) in a non-destructive way, so as not to interfere with subsequent packaging and connection operations.

U.S. Pat. No. 5,221,895 discloses a probe for testing integrated circuits. The probe includes a stiff metal substrate made of beryllium copper alloy, for example. The substrate is generally triangular in form and has two edges that converge from a support area toward a generally rectangular tip area. There is a layer of polyimide over one main face of the substrate, and gold conductor runs are formed over the layer of polyimide. The conductor runs and the metal substrate form microstrip transmission lines. The conductor runs extend parallel to one another over the tip area and fan out toward the support area. A contact bump is deposited on the end of each conductor run that is on the tip area. The tip area of the substrate is slit between each two adjacent conductor runs whereby the tip area is divided into multiple separately flexible fingers that project in cantilever fashion from the major portion of the substrate.

The probe shown in U.S. Pat. No. 5,221,895, is designed to be used in a test station. Such a test station may include four probes having the configuration shown in U.S. Pat. No. 5,221,895, the probes being arranged in an approximately horizontal orientation with their contact bumps facing downwards, with the four rows of contact bumps along four edges of a rectangle. The DUT is generally rectangular and has connection pads along the edges of one face. The DUT is placed in a vacuum chuck with its connection pads upwards. The vacuum chuck drives the DUT upward into contact with the probe, and overdrives the DUT by a predetermined distance from first contact. According to current industry standards, such a test station is designed to produce a nominal contact force of 10 grams at each connection pad. Therefore, the amount of the overdrive is calculated to be such that if contact is made at all connection pads simultaneously, so that each contact bump is deflected by the same amount, the total contact force will be 10 grams force multiplied by the number of connection pads.

If the material of the probe substrate is a beryllium copper alloy and each flexible finger has a length of about 0.75 mm, a width of about 62 microns and a height of about 250 microns, and the probe is supported so that the mechanical ground is at the root of the fingers, the contact force produced at the tip of the finger is about 7.7 grams for each micrometer of deflection of the tip of the finger. Therefore, if the contact bumps at the tips of the fingers are coplanar and the connection pads of the DUT are coplanar, and the plane of the contact bumps is parallel to the plane of the connection pads, an overdrive of about 1.3 microns from first contact will result in the desired contact force of 10 grams at each connection pad. However, if one of the connection pads should be 1.3 microns farther from the plane of the contact bumps than the other connection pads, when the DUT is displaced by 1.3 microns from first contact, there will be no contact force between this connection pad and its contact bump, and all the contact force that is generated will be consumed by the other contacts. If one assumes that the contact force at a connection pad must be at least 50 percent of the nominal contact force in order for there to be a reliable connection, then the maximum variance from the nominal height that this design will accommodate is +/−0.7 microns. However, the height variations of contact bumps and connection pads produced by the standard processes currently employed in the semiconductor industry typically exceed 5 microns.

Furthermore, even if the contact bumps are coplanar and the connection pads are coplanar, tolerances in the probing apparatus make it impossible to ensure that the plane of the connection pads is parallel to the plane of the contact bumps, and, in order to accommodate these tolerances, it is necessary to displace the DUT by 75 microns in order to ensure contact at all connection pads. If the dimensions of the finger were changed to accommodate a displacement of 70–80 microns (75 microns +/−5 microns), the probe would become much less robust. If the probe were supported at a location further back from the root of the fingers, such that most of the deflection would be carried by the substrate rather than the fingers, the ability of the fingers to conform would be limited to 0.13 microns/gram deflection produced at the fingers themselves.

The connection pads of the DUT are not coplanar, nor are the connection bumps on the probe. Assuming that the nominal plane of the connection pads (the plane for which the sum of the squares of the distances of the pads from the plane is a minimum) is parallel with the nominal plane of the contact bumps, the variation in distance between the connection pad and the corresponding contact bump is up to 5 microns if both the DUT and the probe are of good quality.

At present, the connection points on an integrated circuit chip are at a pitch of at least 150 microns, but it is expected that it will be feasible for the pitch to be reduced to about 100 microns within a few years.

As the need arises to make connection at ever finer pitches, the stress in a probe of the kind shown in U.S. Pat. No. 5,221,895 increases. If the connection pads are at a spacing of 75 microns, this implies that the width of the fingers must be less than about 50 microns, and in order to keep the stress below the yield point, the height of the fingers must be at least 400 microns.

The necessary height of the fingers can be reduced by employing a metal of which the yield point is higher than that of beryllium copper. For example, if the substrate is made of stainless steel, having an elastic modulus of $207\times 10^9$ N/m$^2$, the maximum height of the fingers can be reduced to about 350 microns. However, it follows that the deflection is reduced below that necessary to comply with typical height variations found in the industry. Additionally, the resistivity of stainless steel is substantially higher than that of beryllium copper, and this limits the frequency of the signals that can be propagated by the microstrip transmission lines without unacceptable degradation. In general, prior techniques found limited application due to difficulties in achieving adequate deflection with the necessary force to achieve reliable connection, while withstanding the generated stresses.

In addition, although the microstrip transmission line has adequate characteristics for signals up to a frequency of 5 GHz, and it has been discovered that the so-called stripline configuration is desirable for higher frequencies.

U.S. Pat. No. 5,621,333 and PCT/US96/07359, both of which are incorporated herein by reference, disclose improvements and advancements over what is described in U.S. Pat. No. 5,221,895. It has been discovered, however, that further improvements and advancements over such disclosures, particularly with respect to the manufacture and structure and use of such contact devices or probes, is required to make contact devices over probes for fine pitch and other integrated circuits, liquid crystal displays and other electronic devices.

SUMMARY OF THE INVENTION

The present invention provides improvements and advancements over such prior disclosures, particularly with respect to the manufacture and structure and use of such contact devices or probes, is required to make contact devices over probes for fine pitch and other integrated circuits, liquid crystal displays and other electronic devices.

In accordance with a first aspect of such contact devices, there may be provided a method of making a multilayer composite structure for use in manufacture of a contact device for establishing electrical connection to a circuit device, said method comprising providing a substrate of a metal having a resistivity substantially greater than about 10 micro-ohm cm, adhering a first layer of metal having a resistivity less than about 3 micro-ohm cm to a main face of the substrate, the first layer having a main face that is remote from the substrate, adhering a second layer of dielectric material to the main face of the first layer, the second layer having a main face that is remote from the substrate, and adhering a third layer of metal to the main face of the second layer, the metal of the third layer having a resistivity less than about 3 micro-ohm cm.

In accordance with another second aspect of such contact devices, there mayb be provided a method of making a contact device for use in establishing electrical connection to a circuit device, said method comprising providing a substrate of a metal having a resistivity substantially greater than about 10 micro-ohm cm, the substrate having a major portion and a tip portion projecting therefrom along an axis, adhering a first layer of metal having a resistivity less than about 3 micro-ohm cm to a main face of to the substrate, the first layer having a main face that is remote from the substrate, adhering a second layer of dielectric material to the main face of the first layer, the second layer having a main face that is remote from the substrate, adhering a third layer of metal to the main face of the second layer, the metal of the third layer having a resistivity less than about 3 micro-ohm cm, selectively removing metal of the third layer to form discrete conductor runs extending over the tip portion parallel to said axis, while leaving portions of the second layer exposed between the conductor runs, whereby a multi-layer composite structure is formed, and slitting the tip portion of the composite structure parallel to said axis, whereby fingers are formed that project from the major portion of the composite structure in cantilever fashion and each of which supports at least one conductor run.

In accordance with another aspect of such contact devices, there may be provided a probe apparatus for use in testing an integrated circuit embodied in an integrated circuit chip, said probe apparatus comprising a support member having a generally planar datum surface, a generally planar elastic probe member having a proximal end and a distal end, at least one attachment member attaching the probe member at its proximal end to the support member with the probe member in contact with the datum surface, at least one adjustment member effective between the support member and a location on the probe member that is between the proximal and distal ends thereof for urging the distal end of the probe member away from the support member, whereby the probe member undergoes elastic deflection.

In accordance with another aspect of such contact devices, there may be provided a probe apparatus for use in testing an integrated circuit embodied in an integrated circuit chip, said probe apparatus comprising a support member having a bearing surface, a probe member having a proximal end and a distal end and comprising a stiff substrate having first and second opposite main faces and conductor runs extending over the first main face of the substrate from the distal end of the substrate to the proximal end thereof, the conductor runs of the probe member being distributed over a connection region of the first main face of the substrate in a first predetermined pattern, at least one attachment member attaching the probe member to the support member with the second main face of the probe member confronting the bearing surface of the support member, a circuit board comprising a substrate having a main face and conductor runs distributed over a connection region of said main face of the circuit board in a second predetermined pattern, a flexible circuit comprising a flexible substrate having a main face and first and second connection regions, and conductor runs extending between the first and second connection regions of the flexible substrate and distributed over the first connection region in a pattern corresponding to said first pattern and distributed over the second connection region in a pattern corresponding to said second pattern, a first attachment device attaching the flexible circuit to the support member with the first connection region of the flexible circuit confronting the connection region of the probe member and the conductor runs of the flexible circuit in electrically conductive connection with respective conductor runs of the probe member, and a second attachment device attaching the flexible circuit to the circuit board with the second connection region of the flexible circuit confronting the connection region of the circuit board and the conductor runs of the flexible circuit in electrically conductive connection with respective conductor runs of the circuit board.

In accordance with another aspect of such contact devices, there may be provided a method of making a multilayer composite structure for use in manufacture of a contact device for establishing electrical connection to a circuit device, said method comprising providing a substrate, adhering a first layer of dielectric material to a main face of the substrate, the first layer having a main face that is remote from the substrate, and adhering a second layer of metal to the main face of the first layer, the metal of the second layer having a resistivity less than about 3 micro-ohm cm.

In accordance with another aspect of such contact devices, there may be provided a method of making a contact device for use in establishing electrical connection to a circuit device, said method comprising providing a substrate having a major portion and a tip portion projecting therefrom along an axis, adhering a first layer of dielectric material to the main face of the substrate, the first layer having a main face that is remote from the substrate, adhering a second layer of metal to the main face of the first layer, the metal of the second layer having a resistivity less than about 3 micro-ohm cm, selectively removing metal of the second layer to form discrete conductor runs extending over the tip portion parallel to said axis, while leaving portions of the first layer exposed between the conductor runs, whereby a multilayer composite structure is formed, and slitting the tip portion of the composite structure parallel to said axis, whereby fingers are formed that project from the major portion of the composite structure in cantilever fashion and each of which supports at least one conductor run.

In accordance with another aspect of such contact devices, there may be provided a contact device having a plurality of nominally coplanar first contact elements for making electrical contact with corresponding nominally coplanar second contact elements of an electronic device by positioning the contact device and the electronic device so that the plane of the first contact elements is substantially parallel to the plane of the second contact elements and effecting relative displacement of the devices in a direction substantially perpendicular to the plane of the first contact elements and the plane of the second contact elements to generate a contact force of at least f at each pair of corresponding first and second contact elements, wherein it is necessary to effect relative displacement of the devices by a distance d in said direction from first touchdown to last touchdown, said contact device comprising a stiff substrate having a major portion with fingers projecting therefrom in cantilever fashion, each finger having a proximal end at which it is connected to the major portion of the substrate and an opposite distal end and there being at least one, and no more than two, contact elements on the distal end of each finger, a support member to which the substrate is attached in a manner such that on applying force in said direction to the distal ends of the fingers, deflection occurs both in the fingers and in the major portion of the substrate, and means for effecting relative movement of the devices in said direction, and wherein the substrate is dimensioned such that relative displacement of the devices in said direction by a distance d from first touchdown generates a reaction force at each contact element of about $0.1*f+/-0.1*f$, and further relative displacement of the devices in said direction by a distance of about 75 micron or $5*d$ beyond last touchdown generates a reaction force at each contact element of about $0.9*f+/-0.1*f$.

In accordance with another aspect of such contact devices, there may be provided a method for testing/manufacturing devices such as integrated circuits or displays (such as LCD panels), which may include the steps of carrying out a manufacturing process for the DUT, such as a planar-type integrated circuit manufacturing process, positioning the DUT on a positioning device, such as a vacuum chuck (the DUT may be in wafer or die form, in the case of integrated circuits, etc.), effecting alignment of a contact device in accordance with the present invention with the DUT to the extent required for proper placement, effecting relative movement of the DUT with respect to the contact device to establish initial contact thereto (as determined electrically or by a mechanical means), over-driving the relative movement to establish reliable electrical connection, wherein stresses are desirably shared between the extended fingers of the contact device and the substrate of the contact device, applying test signals to the DUT and determining whether the DUT is defective or otherwise within or outside acceptable specifications, recording whether the pass/fail condition of the DUT (which may include mechanical notation, such as inking the DUT if defective, etc., or by data recording), removing the DUT from the positioning device, and packaging and assembling the DUT if acceptable.

With the present invention, devices with connection points of fine pitch may be reliably tested and manufactured, and in particular improved contact devices, improved methods of making contact devices, and improved methods of producing electronic devices may be obtained in accordance with various preferred embodiments and aspects as described elsewhere herein.

BRIEF DESCRIPTION OF THE DRAWINGS

For a better understanding of the invention and to show how the same may be carried into effect, reference will now be made, by way of example, to the accompanying drawings in which.

DETAILED DESCRIPTION OF THE PREFERRED EMBODIMENTS

The context for the present invention will be by way of the disclosure in U.S. Pat. No. 5,621,333 and PCT/US96/07359, which are incorporated herein by reference. Thereafter, improvements and advancements over such disclosures in accordance with the present invention, particularly with respect to the manufacture and structure of such contact devices or probes, will be described. It is understood that methods and structure may be used for testing fine pitch and other integrated circuits, liquid crystal displays and other electronic devices.

Figure 1:
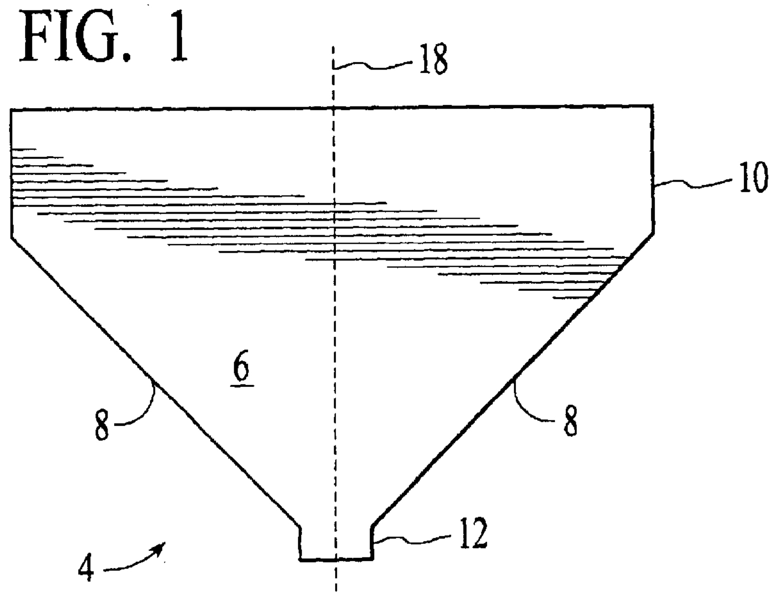
FIGS. 1–5 illustrate various steps during fabrication of a contact device that may embody the present invention, FIGS. 1 and 4 being plan views and FIGS. 2, 3 and 5 being sectional views.

FIG. 1 illustrates a substrate 4 of elastic metal having an upper main face 6 and a lower main face. In a preferred embodiment of the invention, the substrate is stainless steel and is about 125 microns thick. The substrate is generally triangular in form, having two edges 8 that converge from a support area 10 toward a generally rectangular tip area 12. The substrate is substantially mirror-image symmetrical about a central axis 18.

Figure 2:
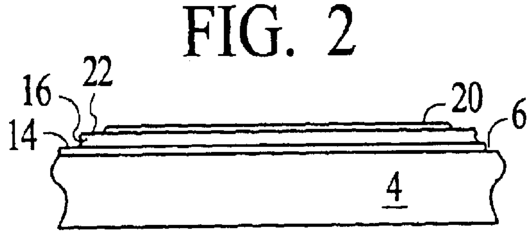

Referring to FIG. 2, a thin film 14 of gold is deposited on the upper main face 6 of the substrate 4 by evaporation or sputtering. The gold film may be augmented by plating if desired. An insulating material such as polyimide is spun or sprayed onto the upper main face of the film 14 in the liquid phase and is then cured to form a layer 16 about 25 microns thick.

Figure 3:
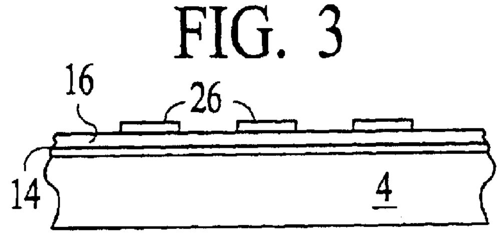
Figure 4:
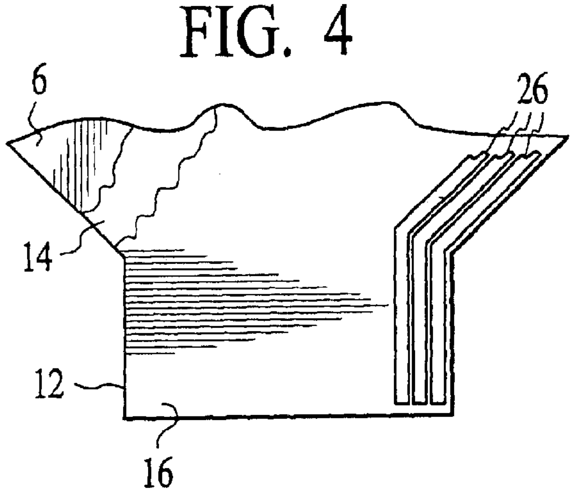
Figure 5:
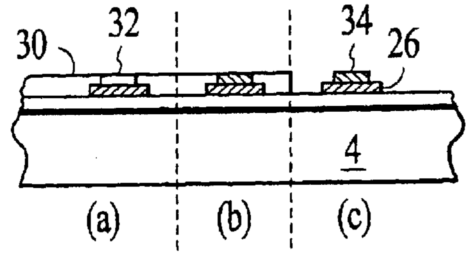

A layer 20 of gold is deposited over the upper main face 22 of the layer 16 by evaporation or sputtering. The layer 20 is patterned using conventional photolithographic techniques to form strips 26 that extend parallel to the central axis 18 over the tip area 12 of the probe and fan out from the tip area over the triangular part of the substrate 4 toward the support area 10 but which may be connected together at the support area. Each strip has a proximal end and a distal end relative to the support area 10. Additional metal is then deposited over the strips by plating. After the strips have been built up to the desired thickness, which may be about 12 microns, a layer 30 of photomask material (FIG. 5) is deposited over the upper surface of the structure shown in FIGS. 3 and 4 and holes 32 are formed in that layer over the distal end of each strip 26, as shown in portion (a) of FIG. 5. A hard contact metal, such as nickel, is deposited into these holes (FIG. 5, portion (b)) by plating, and the photomask material is then removed (FIG. 5, portion (c)). The connections between the strips are removed by etching. In this manner, separate conductor runs are formed over the layer 16, and each conductor run has a contact bump 34 over its distal end. The conductor runs are 50 microns wide and are at a spacing between centers of about 125 over the tip area.

Figure 6:
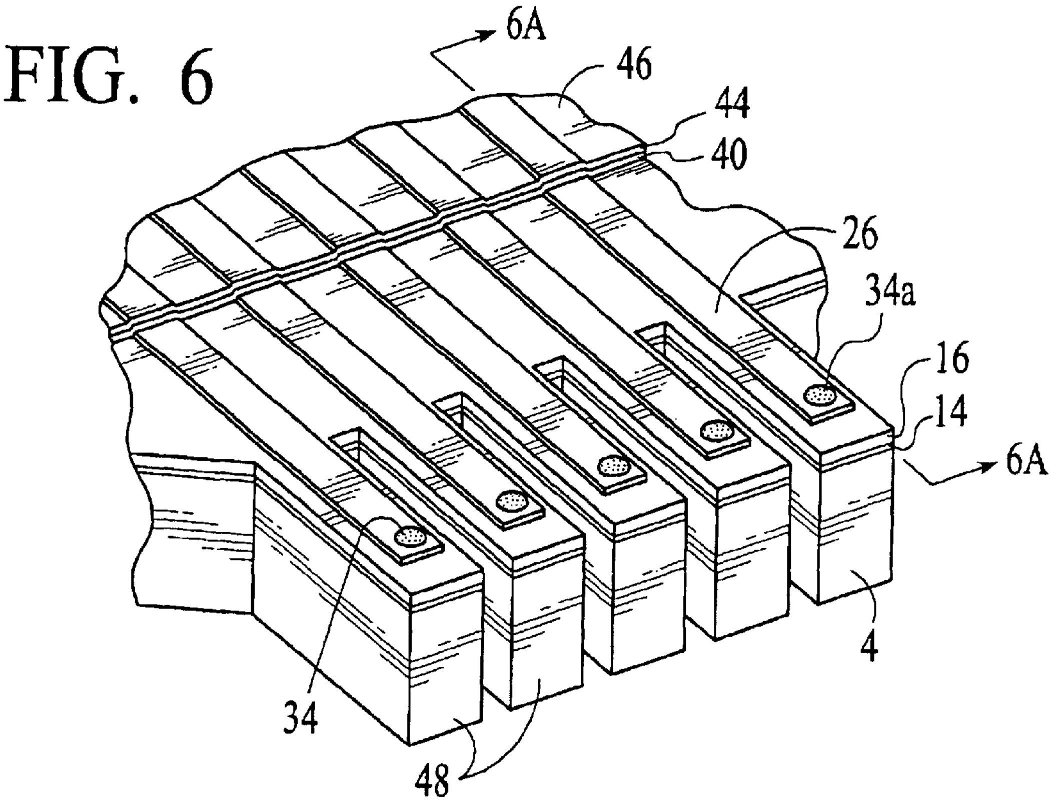
FIG. 6 is a partial perspective view of a contact device that may embody the invention.
Figure 6A:
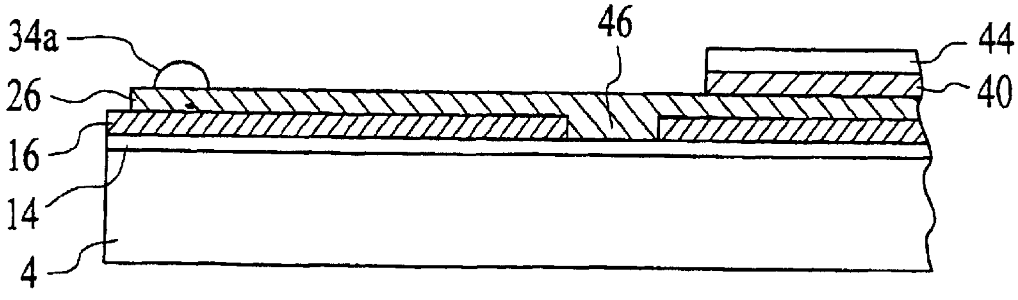
FIG. 6A is a sectional view on the line VIA—VIA of FIG. 6.

Referring to FIG. 6, a cover layer 40 of polyimide is formed over the conductor runs 26, over a region of the substrate that is to the rear, i.e. toward the support area 10, of the rectangular tip area 12 and a layer 44 of gold is deposited over the layer 40 by evaporation or sputtering. The layer 44 may be augmented by plating. The result of the fabrication steps described above is a multilayer structure that comprises the substrate 4, the gold film 14, the polyimide layer 16, the gold conductor runs 26, the polyimide layer 40, and the gold layer 44.

The tip area of the multilayer structure is then slit, whereby the tip area is divided into multiple separately flexible fingers 48 that project in cantilever fashion from the major portion of the structure. A given finger of the substrate may carry the distal end portion of a single conductor run, or it may carry the distal end portions of two adjacent conductor runs. The slitting of the tip area may be performed by ablation using a ultraviolet laser. The poor thermal conductivity of stainless steel is a favorable factor with regard to the laser ablation process. The width of the kerf that is removed is about 17 microns, so that the width of a finger is either about 108 microns or about 233 microns. The length of each finger is about 1 mm.

The structure shown in FIG. 6 may be used as a contact device for making electrical connection to contact pads of an electrical circuit device, such as an integrated circuit chip or a flat panel display device. The nickel bumps 34 serve as probe elements for contacting the connection pads of the circuit device. When the contact device is in use, each nickel bump contacts a single connection pad of the circuit device. A bump 34*a* that is to contact a ground pad of the circuit device may be connected to the substrate by means of vias 46 formed in holes in the layer 16 before depositing the layer 20. Multiple vias 46 may be provided along the length of the conductor run 26 that ends at the bump 34*a* in order to ensure that the contact bump 34*a* is firmly grounded.

The configuration of the conductor runs and their spacing results in there being a stripline transmission line environment to the rear of the forward boundary of the layer 44, whereas there is a microstrip transmission line environment forward of the layer 44. Naturally, the slitting of the tip area results in degradation of the microstrip transmission line environment. In the case of the fingers being about 1 mm long, the microstrip transmission line environment extends to a point that is about 2 mm from the contact bumps. However the degradation is not so severe as to distort signals at frequencies below about 10 GHz to an unacceptable degree.

The structure shown in FIG. 6 may be used for probing a circuit device in a semiconductor tester, as will be described with reference to FIGS. 7–11.

Figure 7:
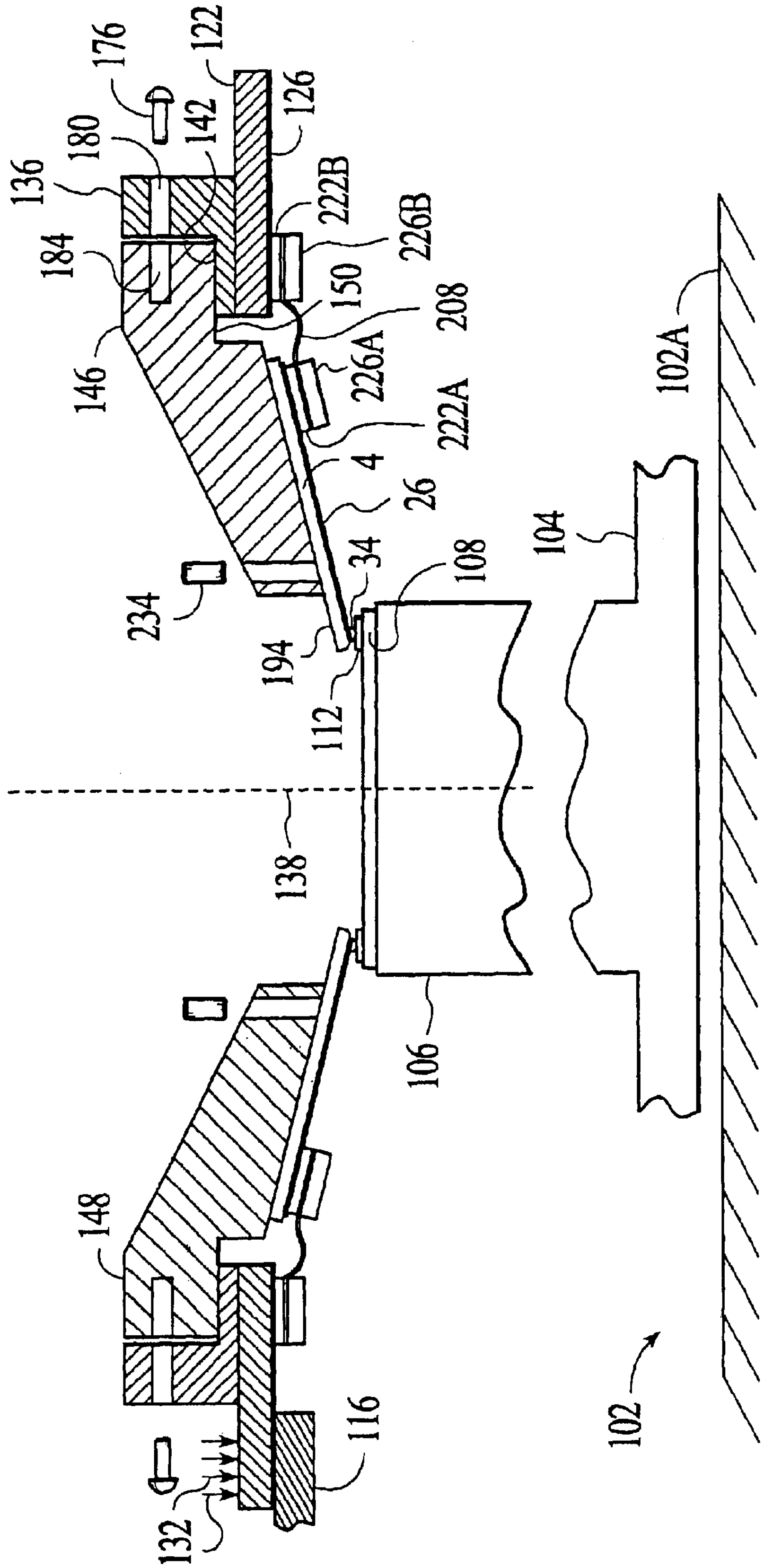
FIG. 7 is a general view, partly in section, of a semiconductor tester.
Figure 8:
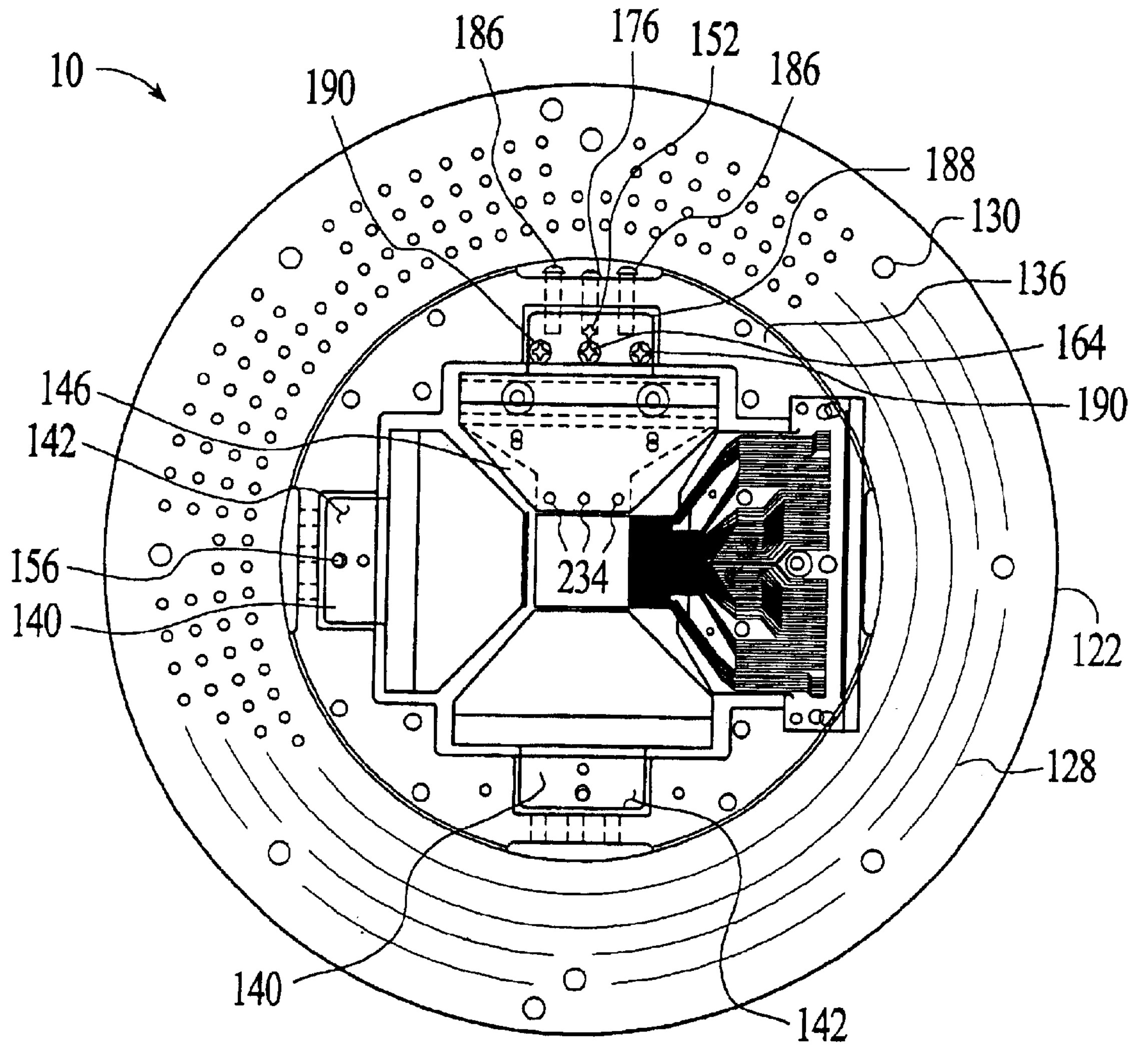
FIG. 8 is a plan view of a circuit board and mounting plate that form part of the test head of the tester shown in FIG. 7.

Referring to FIG. 7, the tester comprises a prober 102 having a frame 102*a* that serves as a mechanical ground. A device positioner 104 having a vacuum chuck 106 is mounted within or as part of the prober 102. The prober includes stepping motors (not shown) that act on the device positioner for translating the vacuum chuck relative to the frame 102*a* in two perpendicular horizontal directions (X and Y) and vertically (Z), and for rotating the vacuum chuck about a vertical axis. The vacuum chuck holds a device under test, or DUT, 108. FIG. 7 illustrates the DUT 108 as a die that has previously been separated from other dice of the wafer in which it was fabricated, but it will be appreciated that, with appropriate modifications, the apparatus could be used for testing a semiconductor device at the wafer stage. As shown in FIG. 7, the DUT 108 has contact pads 112.

The tester also comprises a test head 116 that can be docked to the prober so that it is in a reliably reproducible position relative to the prober frame 102*a*. The test head 116 includes an essentially rigid circuit board 122 (FIG. 8) that comprises an insulating substrate and conductor runs 126 exposed at the lower main face of the substrate. Vias (not shown) extend through the substrate and terminate at contact pads 128 that are exposed at the upper main face of the substrate. The circuit board 122 is removably held in the test head by screws that pass through holes 130 in the circuit board. When the test head 116 is docked in the prober 102 and the circuit board 122 is installed in the test head, the circuit board 122 is disposed horizontally and the contact pads 128 engage pogo pins 132, shown schematically in FIG. 7, by which the contact pads of the circuit board are connected to stimulus and response instruments (not shown), for purposes of conducting appropriate tests on the DUT.

A mounting plate 136 is secured to the circuit board 122. The mounting plate is positioned relative to the circuit board by guide pins 134 that project downward from the mounting plate and enter corresponding holes in the circuit board. The manner in which the mounting plate is attached to the circuit board will be described below.

The mounting plate has a generally cylindrical exterior surface of which the central axis 138 is considered to be the axis of the plate. The plate 136 is disposed with its axis 138 vertical and defines a cross-shaped through opening (FIG. 9) that is mirror image symmetrical about X-Z and Y-Z planes that intersect at the axis 138. At the outer end of each limb of the cross, the plate 136 is formed with a notch 140 that extends only part way through the plate and is bounded in the vertically downward direction by a horizontal surface 142.

A backup block 146 having the general shape, when viewed in plan, of a trapezoid seated on a rectangular base is positioned with its rectangular base in one of the notches 140. Similar backup blocks 148 are mounted in the other notches. The following description of the backup block 146 and associated components applies equally to the backup blocks 148.

The rectangular base of the backup block 146 has a planar mounting surface 150 (FIG. 7) that can be seated against the horizontal surface 142 at the bottom of the notch 140. For assembling the backup block 146 to the mounting plate 136, the backup block is formed with a hole 152 extruding through its rectangular base, and the mounting plate is formed with a blind hole 156 that is parallel to the axis of the mounting plate and enters the plate 136 at the horizontal surface 142. A guide pin 160 is inserted through the hole 152 in the backup block and into the blind hole 156 in the mounting plate, and in this manner the backup block is positioned with a moderate degree of precision relative to the mounting plate.

Figure 9:
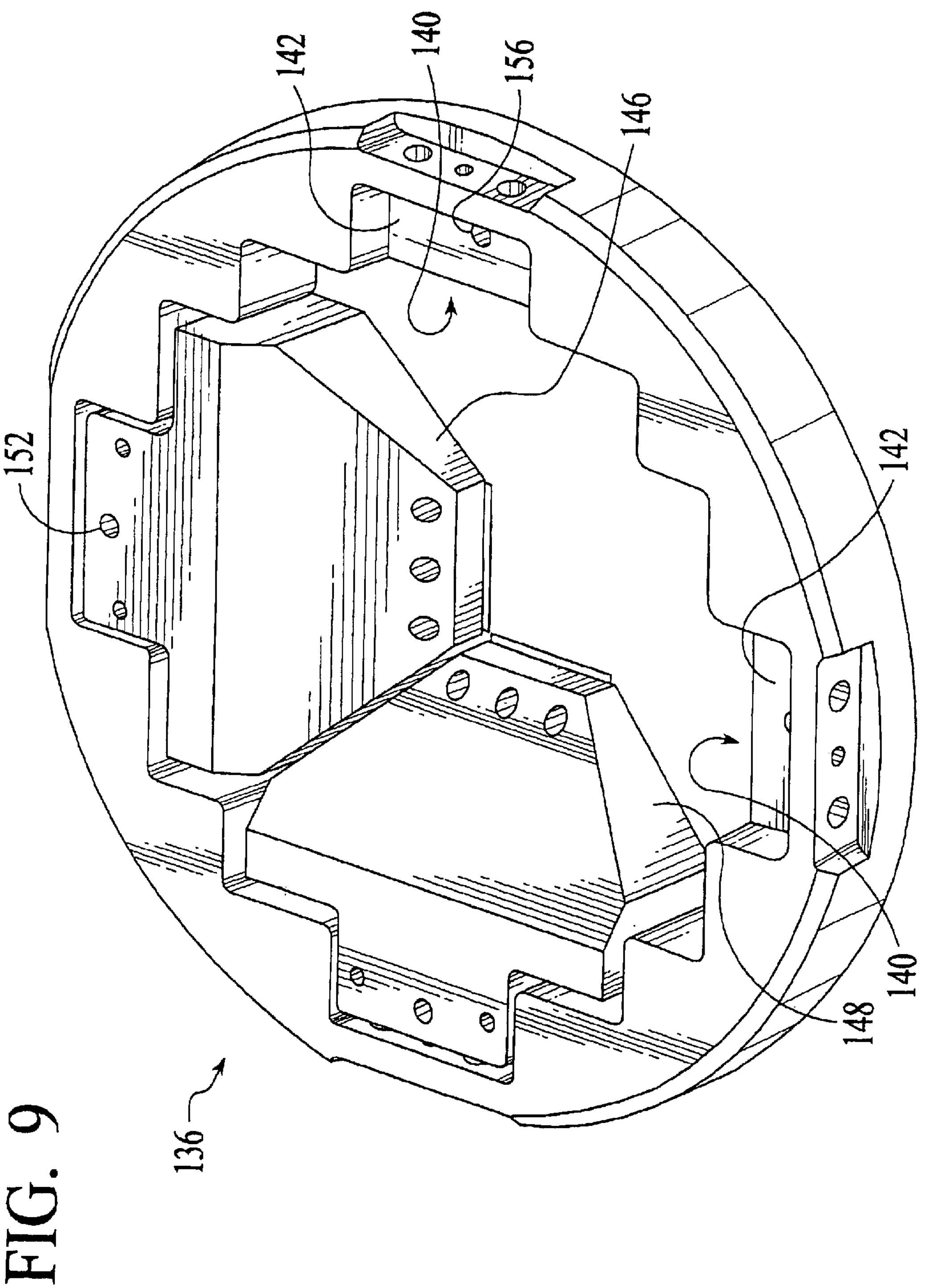
FIG. 9 is an enlarged perspective view of the mounting plate and also illustrates back-up blocks that are attached to the mounting plate.
Figure 9A:
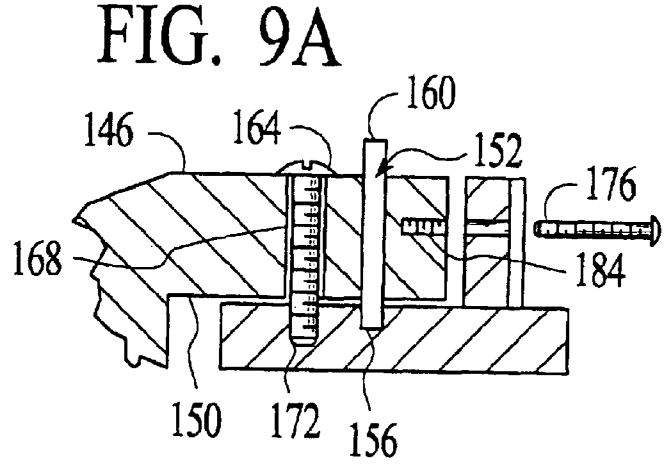
FIGS. 9A, 9B, and 9C are sectional views illustrating the manner in which the back-up blocks are attached to the mounting plate.
Figure 9B:
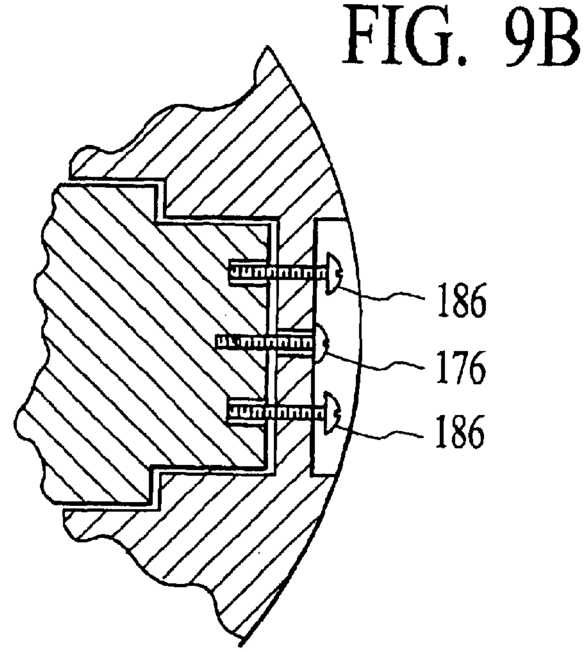
Figure 9C:
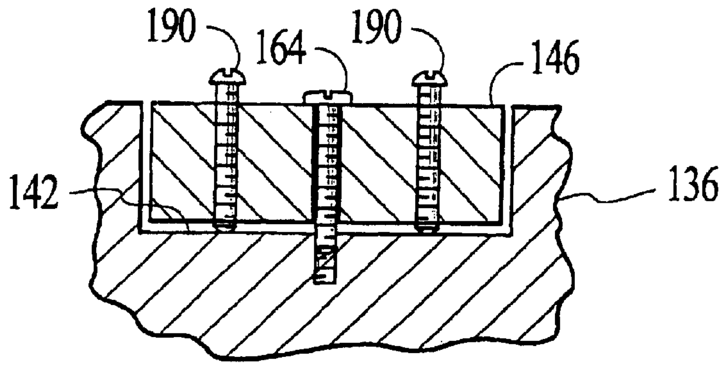

The backup block 146 is then attached to the mounting plate 136 by a vertical locking screw 164 (FIG. 8, FIG. 9A) that passes through a clearance hole 168 in the backup block 146 and enters a threaded bore 172 in the mounting plate 136 and a horizontal locking screw 176 (FIG. 7) that passes through a clearance hole 180 in the mounting plate and enters a threaded bore 184 in the backup block. The backup block 146 is thereby attached to the mounting plate, and the guide pin 160 is then removed. The clearance holes 168 and 180 allow a small degree of horizontal and vertical movement of the backup block relative to the mounting plate.

Two horizontal screws 186, which are horizontally spaced and disposed one on each side of the screw 176, are inserted through threaded holes in the peripheral wall of the plate 136 and enter blind clearance holes in the backup block. Similarly, two vertical screws 190, which are horizontally spaced and disposed one on each side of the screw 164, are inserted through threaded holes in the backup block 146 and engage the surface 142 of the mounting plate 136. The screws 176 and 186 can be used to adjust the horizontal position of the backup block relative to the mounting plate 136. By selectively turning the screws 176 and 186, the backup block can be advanced or retracted linearly and/or rotated about a vertical axis. In similar fashion, using screws 164 and 190, the backup block can be raised or lowered relative to the mounting plate and/or tilted about a horizontal axis. When the backup block is in the desired position and orientation, the locking screws are tightened.

The apparatus shown in FIGS. 7–10 also comprises a contact device 194 associated with the backup block 146. The contact device 194 is generally triangular and has two edges that converge from a support area toward a generally rectangular tip area. The tip area of the contact device is divided into multiple fingers that extend parallel to an axis of symmetry of the contact device. The contact device includes conductor runs that extend from the support area to the tip area, and one run extends along each finger in the tip area. At its support area, the conductor runs of the contact device are exposed on the underside of the contact device. The contact device may be fabricated by the method that is described above with reference to FIGS. 1–6.

Inboard of the rectangular base, the trapezoidal portion of the backup block 146 extends downward toward the central axis 138. The contact device 194 is disposed below the inclined lower surface of the backup block 146 and is positioned relative to the backup block by guide pins 202 (e.g., FIGS. 11A and 11B) that project from the backup block and pass through alignment holes 204 in the contact device. The manner in which the contact device is attached to the backup block will be described below.

Figure 10:
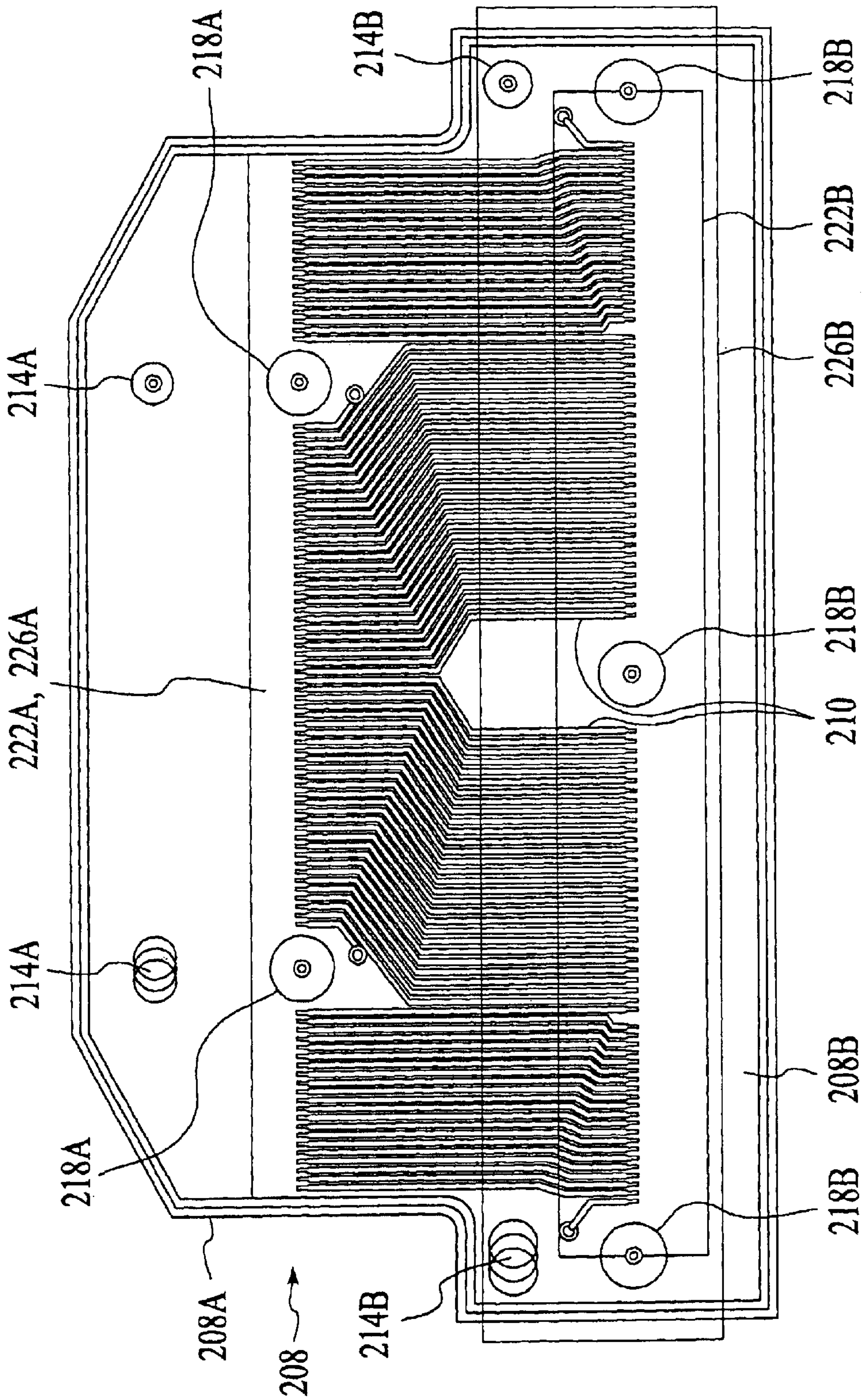
FIG. 10 is an enlarged view of a flexible circuit that is used to connect the circuit board to the contact device.
Figure 11A:
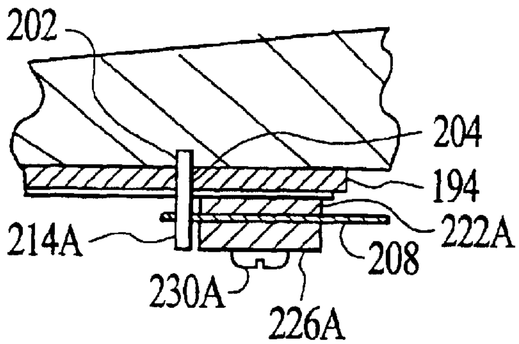
FIGS. 11A and 11B are sectional views illustrating the manner in which the contact device and the flexible circuit are positioned relative to the mounting block.
Figure 11B:
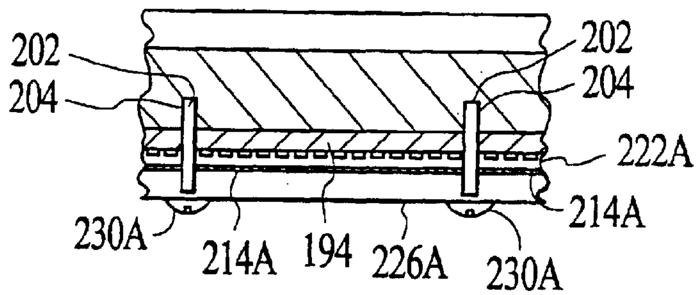
Figure 12A:
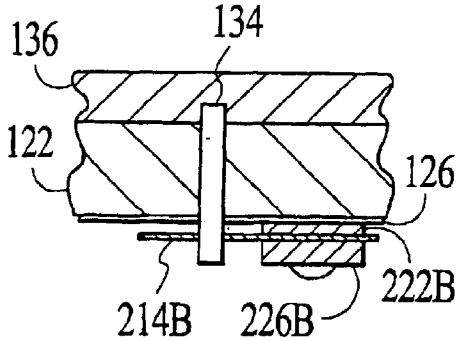
FIGS. 12A and 12B are sectional views illustrating the manner in which the mounting plate and the flexible circuit are positioned relative to the circuit board
Figure 12B:
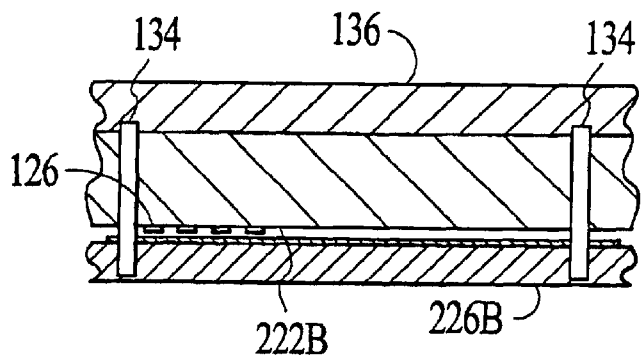

The apparatus also comprises a flexible circuit 208 having an inner edge region 208A and an outer edge region 208B (e.g., FIG. 10). The flexible circuit comprises a substrate of polyimide or similar insulating material, a ground plane (not shown) on the lower side of the substrate, and multiple discrete conductor runs 210 on the upper side of the substrate. Over the inner edge region 208A, the spacing of the conductor runs 210 corresponds to the spacing of the conductor runs across the support area of the contact device 194, and over the outer edge region 208B, the spacing of the conductor runs 210 corresponds to the spacing of the conductor runs 126 along the inner edge of the printed circuit board 122.

The flexible circuit is formed with inner and outer pairs of alignment holes 214A and 214B. The inner pair of alignment holes 214A are threaded by the guide pins 202, whereby the inner edge region 208A is positioned relative to the contact device 194. Similarly, the outer pair of alignment holes 214B are threaded by the guide pins 134, whereby the outer edge region 208B of the flexible circuit is positioned relative to the printed circuit board. The flexible circuit is also formed with two sets of mounting holes 218A and 218B.

The support area of the contact device 194, the inner edge region 208A of the flexible circuit, and a first length 222A of Shinetsu strip are clamped between the backup block and a clamping plate 226A by means of screws 230A. The outer edge region 208B of the flexible circuit 208, the inner region of the printed circuit board 122, and a second length 222B of Shinetsu strip are clamped between the mounting plate 136 and a second clamping plate 226B by means of screws 230B. The positions of the alignment holes 214A and 214B relative to the conductor runs of the flexible circuit are such that the conductor runs 210 at the inner edge region 208A of the flexible circuit are in registration with the conductor runs 26 in the support area of the contact device, and the conductor runs 210 in the outer edge region 208B of the flexible circuit are in registration with the conductor runs 126 along the inner edge of the printed circuit board. The Shinetsu strip, the thickness of which is exaggerated in FIG. 7, is characterized by anisotropic electrical conductivity when compressed perpendicular to its length: its conductivity is very good in directions perpendicular to its own plane and is very bad in directions parallel to its own plane and to its length. Thus, the Shinetsu strip 222A connects the conductor runs 26 of the probe member 194 to respective conductor runs 210 of the flexible circuit 208, and the Shinetsu strip 222B connects the conductor runs 210 of the flexible circuit 208 to respective conductor runs 126 of the printed circuit board 122.

Tightening of the clamping screws compresses the Shinetsu strips, which then establish a good electrically conductive connection between the conductor runs of the contact device and the conductor runs 126 of the printed circuit board 122, through the Shinetsu strips and respective conductor runs of the flexible circuit 208.

As described with reference to FIGS. 1–6, the tip area of the contact device 194 is divided into fingers, each of which has a contact run that terminates in a contact bump. Since the tip area is spaced from the support area, at which the contact device is clamped to the backup block, the tip area can be deflected away from the plane of the underside of the backup block. Vertical adjustment screws 234 are fitted in respective threaded holes in the backup block 146. By appropriate adjustment of the screws 234, the contact device can be preloaded to a condition in which the contact device 194 is deflected downwards relative to the backup block 146, and by further adjustment of the screws 234 the tip area can be forced downward, or permitted to rise, or tilted about the axis 18. It is important to note that the "mechanical ground" therefore extends to a location of the contact device that is beyond the support area but does not extend as far as the lip area. As described more fully below, proper positioning of mechanical ground can enable stress sharing between the fingers of the contact device and the contact device substrate, thereby enabling the contact device to withstand the stresses that result from applying force sufficient to ensure reliable contact between the DUT and the contact device, given the irregularities that can be expected in actual devices/conditions.

When all four backup blocks are properly installed in the mounting plate 136, the tip portions of the four contact devices extend along four edges of a square and are positioned for making electrically conductive contact to the contact pads of the device under test. By observing the DUT through the opening defined between the inner ends of the four backup blocks, the DUT can be positioned for contacting the contact bumps when the DUT is raised by the positioning device.

When the DUT is raised relative to the test head, the contact pads of the DUT engage the contact bumps of the contact device. After initial contact has been established (first touchdown), the DUT is raised an initial 10–15 microns, which is sufficient to absorb any expected error in coplanarity of the contact bumps and contact pads and achieve last touchdown (each contact bump is in contact with its respective contact pad). The DUT is then raised by a further 75 microns. The spring rate of the fingers and the spring rate of the base region of the substrate, between the fingers and the support area, are such that the contact force exerted at each contact pad is at least 10 grams. The initial deflection of 10–15 microns is sufficient to provide a contact force of about 2 grams at a single finger, whereas the further deflection of 75 microns provides a contact force of N*10 grams, where N is the number of fingers, or 10 grams per finger. By sharing the deflection between the fingers and the base region of the substrate, a high degree of compliance may be achieved, allowing contact with all the contact bumps, without sacrificing the contact force that is needed to achieve a reliable electrical contact between the contact bumps and the fingers.

The elastic nature of the metal of the substrate ensures that when the DUT is brought into contact with the contact bumps, and is slightly over driven, deflection of the fingers provides a desirable scrubbing action and also supplies sufficient contact force for providing a reliable pressure contact between the contact bump and the connection pad of the DUT.

The film 14 of gold may serve as the ground plane, and the substrate 4, although conductive, may not contribute to the electrical performance of the device, although this depends on the thickness and constituent material of the substrate. In alternative embodiments, for example, the substrate is of sufficient thickness so that it provides sufficient conductivity to serve as the ground plane, or may consist of beryllium copper, and thereby provide sufficient thickness to serve as the ground plane, with or without gold film 14.

It is should be particularly emphasized how the present invention achieves desirous stress load sharing between the fingers and the substrate. It has been determined that with available materials, to be of practical size and provide suitable compliance/deflection of the fingers (such as to accommodate deviations from coplanarity, etc.), stress loads induced in the fingers and the substrate should be balanced (i.e., maintained in an acceptable relative range, below the stress limit of the material). Proper positioning of a mechanical ground between the ends of the fingers and the back extremity of the support area can enable controlled balancing of the relative stress loads, while also ensuring an adequate deflection of the fingers to achieve adequate compliance. In preferred embodiments, the relative stress loads of the fingers and substrate are maintained/balanced in a ranges of about 0.7 to 1.3, 0.8 to 1.2 or 0.9 to 1.1. Other ranges may be utilized, provided that a desirable balance is maintained, while of meeting the conditions of adequate deflection/compliance in the fingers, while staying within the stress limits of the constant materials.

In combination with the stress load balancing, it also has been discovered that, with available materials, the length of the fingers, controlled by the length of the slit and overall physical geometry, etc., can be chosen to give the desired finger deflection/compliance, such as a desired deflection of greater than about 5 microns, 10 microns, 12, microns or 15 microns, in the case of, for example, 60–80 or 75 microns, etc., of overdrive, while maintaining stress balancing as described above, which can produce a probe element that produces reliable connection with the DUT while surviving the resulting stress loads, etc.

The present invention may be desirably applied to the testing and manufacture of devices such as integrated circuits or displays (such as LCD panels). Initially, a manufacturing process for the DUT 108 is conducted, such as a planar-type integrated circuit manufacturing process. For display devices, an appropriate LCD or other manufacturing process is conducted. After such manufacturing, the DUT 108 is positioned on a positioning device, such as vacuum chuck 106 of prober 102 (the DUT may be in wafer or die form, in the case of integrated circuits, etc.). The DUT 108 is aligned with contact device 194 to the extent required for proper placement. Thereafter, relative movement is effected of the DUT 108 with respect to the contact device 194 to establish initial contact therebetween (as determined electrically or by a known mechanical means). After initial contact, over-driving of the relative movement to a predetermined degree is conducted (such as described above) to establish reliable electrical connection, wherein stresses are desirably shared between the extended fingers of the contact device and the substrate of the contact device. Positioning of a mechanical ground as in the present invention is particularly desirous in this regard. Thereafter, test signals are applied to the DUT 108 and it is electrically determined whether the DUT is defective or otherwise within or outside acceptable specifications. The pass/fail condition of the DUT may be recorded (which may include mechanical notation, such as inking the DUT if defective, etc., or by data recording). Still thereafter, the DUT 108 may be removed from the positioning device. If the device is acceptable, known packaging and assembling of the DUT may be performed.

With the present invention, devices with connection points of fine pitch may be reliably tested and manufactured.

Conventional laser or other cutting of contact devices such as disclosed in U.S. Pat. No. 5,621,333, however, have been determined to be inadequate for fine pitch or otherwise more optimal contact devices. The present invention particularly provides improved methods for producing such contact devices.

An important process in the formation of the contact device is cutting, preferably with a laser, fingers in the contact structure (see e.g., FIG. 6). In accordance with preferred embodiments of the present invention, improved laser cutting processes are provided, which will now be described with reference to FIGS. 13 to 15. With such improved methods and implements to be hereinafter described, improved laser cutting of probe members in accordance with the present invention may be achieved.

Figure 13:
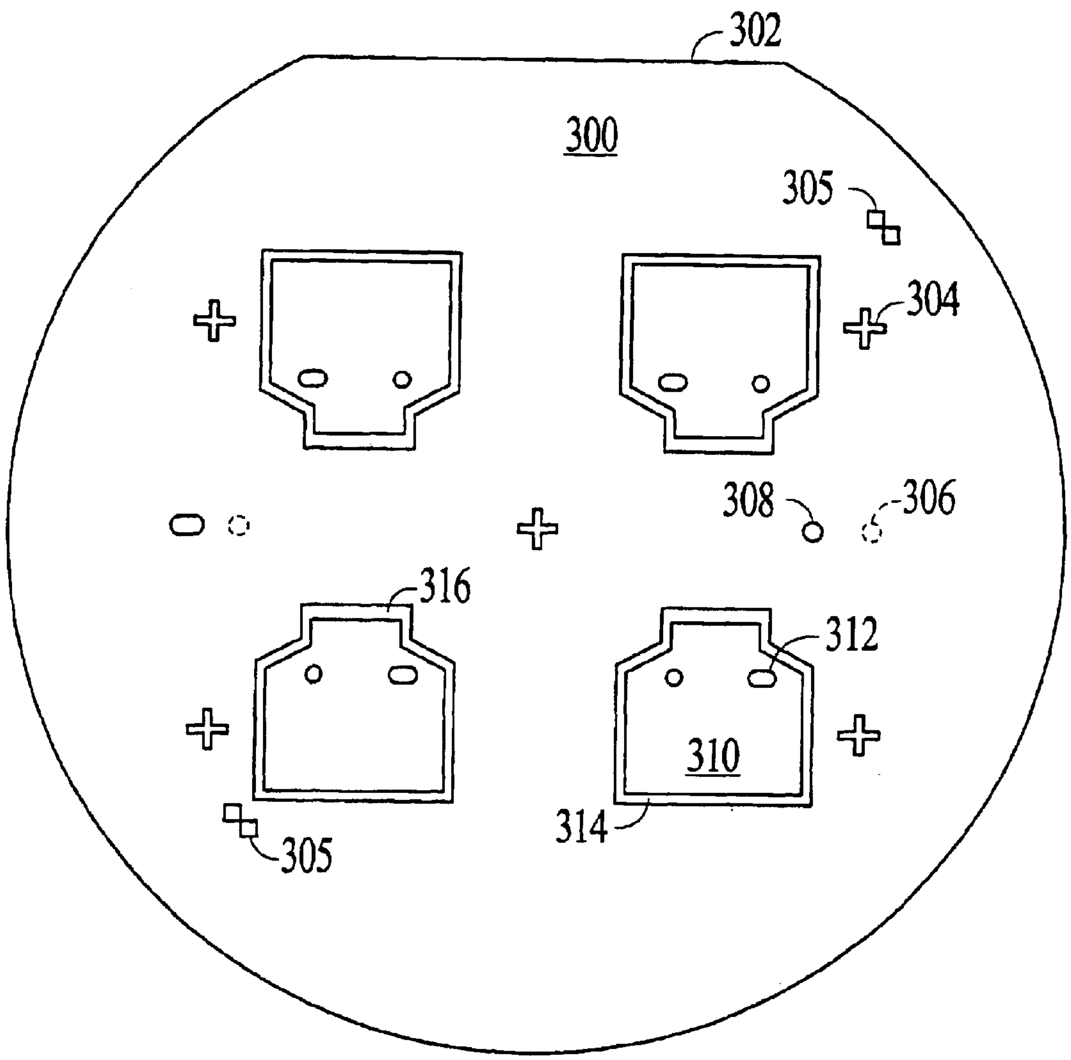
FIG. 13 illustrates a substrate with four exemplary probe members for purposes of explaining preferred embodiments of fabrication processes in accordance with the present invention.

FIG. 13 illustrates substrate or wafer 300, having alignment flat 302, on which is patterned (in this illustrative embodiment) four quadrants of probe members 310 of a contact device. Some contact devices may, for example, only use two rows of contacts, and thus only two portions need be cut for a complete probe. In such embodiments, four probe members 310 could be included on substrate 300 and cutting performed so as to produce two complete contact devices. The number of probe members per contact device, and the numbers of probe members per substrate, may vary depending upon the particular application, although four quadrant probe members 310 are illustrated for a conventional four sided integrated circuit or display, etc. Substrate 300 also preferably includes guide pin holes 308 and fiducials 304 (fiducials 304 are to be cut with the laser, as will be described hereinafter). Substrate 300 also preferably includes fiducials 305, which are preferably formed as part of the photolithography steps that are used to produce substrate 300, and which serve to provide a known positional reference for substrate 300 (and probe members 310) for the laser positional and motion system. It also should be noted that probe members 310 are shown with outline 314. In preferred embodiments, outline 314 is not provided as part of the photolithographic or other processes that produce substrate 300, but instead are provided by cutting of the laser. For illustrative purposes, outlines 314 are shown in FIG. 13.

Figure 14:
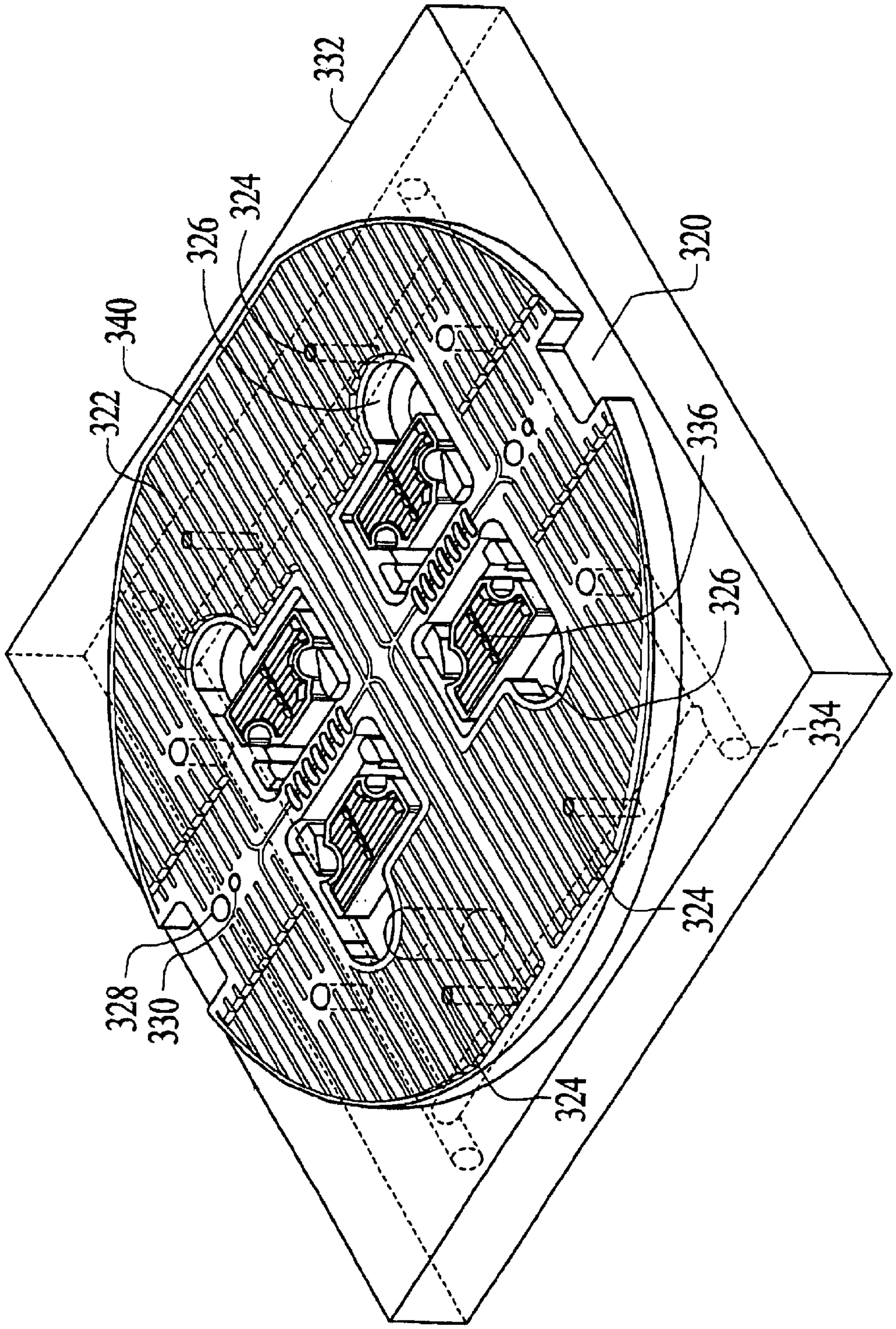
FIG. 14 is a diagram illustrated a chuck used in fabricating contact devices in accordance with preferred embodiments of the present invention.

Substrate 300 is cut by being fixedly positioned on chuck 332, illustrated in FIG. 14. Probe members 310 align on islands 336 of chuck 332, the areas to be laser cut being positioned over openings, grooves or indentations 326. Chuck 332 is machined or tooled so that all laser cuts are over indentations 326 in order for laser cutting debris or dross to exit. Islands 336 of chuck 332 are provided with separate vacuum pull down hole 336 and vacuum grooves 322 in order to provide pull down on probe member 310 at points near where laser cutting is to be performed. It has been discovered that peripheral vacuum pull down only does not enable fine slits to be cut as may be achieved with the preferred embodiment of chuck 332.

It also should be noted that chuck 332 includes alignment flat 340, a plurality of peripheral vacuum holes 324 connecting to manifold 334, which is formed in the interior of chuck 332 and provides "plumbing" to route the vacuum to the peripheral vacuum holes 324 and island vacuum holes 336, etc. Chuck 332 also preferably includes indentation 320, which serves to enable wafer 300 to be picked up from chuck 332 with conventional wafer tongs or the like. Chuck 332 also includes guide pin cutting holes 328 and guide pin holes 330. It should be noted that guide pin cutting holes 328 are larger than guide pin holes 330. One guide pin cutting hole 328 is positioned next to a guide pin hole 330, with two such pairs illustrated for illustrative purposes (more than two guide pin cutting holes and more than two guide pin holes could be provided; e.g., three pairs or four pairs of such holes, etc.). Each guide pin cutting hole is shifted in the same direction, e.g., left or right (left in FIG. 14), from the corresponding guide pin hole. As will be explained later, such a consistent shifting enables holes for guide pins to be more efficiently formed in substrate 300.

It also should be noted that chuck 332 may be formed of two pieces, the rectangular base portion, and the rounded top portion. The base portion could be formed in a manner to be common to a variety of top portions, while particular top portions may be produced to be used with one or more than one particular probe members to be laser cut. With such a two piece chuck, the rectangular base portion may be used for more than top portion, thereby obviating the need for machining of the base portion for each top portion. A particular top portion may be secured to the base portion by suitable guide pins or small profile screws or the like in such a manner that top portions are secured to the base portion in a physical position so as to line up in a corresponding manner with plumbing or manifold ports in the base portion, so that a desirable vacuum may be applied to the substrate by way of the top portion.

Laser cutting is more optimally performed in accordance with embodiments of the present invention as follows. Substrate 300 is initially produced to have probe members with conductors of the desired number, position and shape, such as described previously. Substrate 300 is positioned on chuck 332, preferably with the circuit side facing the direction of the laser beam; chuck 332 is positioned on, or a part of, the laser positioning and motion system, in a predetermined manner. The optical system of the laser may automatically or manually be used to locate a position of a known feature on substrate 300, such as fiducials 305 or the conductors formed as part of probe members 310. The laser positional and motion system may thus have a predetermined positional reference to both chuck 332 and substrate 300. It also should be noted that data determinative of the features of substrate 300, which may include fiducials 305, the conductor runs of probe members 310 and/or the tracks where laser cutting is to be performed, preferably is provided in the form of a data file, such as a DXF (design exchange format) or other suitable data file, preferably created as a part of the process that produced substrate 300.

With positional references known, fiducials 304 may be cut with the laser. Laser cut fiducials 304 are used in order to conduct the main laser cutting with the circuit or conductor run side of substrate 300 facing away from the laser beam. Such cutting from the back side has been determined to produce more optimal cutting of the fingers of the contact device.

Before or after fiducials 304 are formed, guide pin holes 308 also are formed by laser cutting. With the conductor run side of substrate 300 facing the direction of the laser beam, guide pin holes 308 overlay guide pin cutting holes 328 of chuck 332. The ultimate position of guide pin holes 308 vis-a-vis guide pin holes 330 of chuck 332, illustrated by dotted line holes 306, will correspond in a desired manner when substrate 300 is flipped over and re-positioned on chuck 332. As previously expanded, with the guide pin cutting holes offset from the guide pin holes in a consistent directional manner, guide pin holes 308 may be laser cut with the conductor run side of substrate 300 facing the laser beam direction (and with guide pin holes 308 of substrate 300 overlying guide pin cutting holes 328 of chuck 332), and thereafter substrate 300 may be flipped over and repositioned on chuck 332 so that guide pin holes 308 of substrate 300 overlay guide pin holes 330 of chuck 332, and thus the position of substrate 300, with the conductor run side now facing away from the direction of the laser beam, may be secured on chuck 332 in a predetermined manner with guide pins. It should be noted that one of guide pin holes 308 of substrate 300 is preferably formed as a slightly elongated hole or slot. This will enable some minimal movement of substrate 300 vis-a-vis chuck 332 in order to accommodate thermal coefficient of expansion mismatches between the chuck 332 and substrate 300.

As previously described, DXF or other suitable data files preferably are provided to the laser positional and motion system. With substrate 300 positioned on chuck 332, conductor run side facing away from the direction of the laser beam, laser cutting may proceed. It should be noted that fiducials 304 previously cut with the laser are visible to the laser optical system when substrate 300 is positioned on chuck 332 with the conductor runs facing away from the direction of the laser beam, thereby serving as an automatic or manual aid to the alignment of the laser positional and motion system to the desired cutting tracks on substrate 300. With the laser cutting tracks input by a suitable data file to the laser system, the laser may desirably cut the fingers and outline of probe members 310 in a more accurate and optimum manner.

Figure 15A:
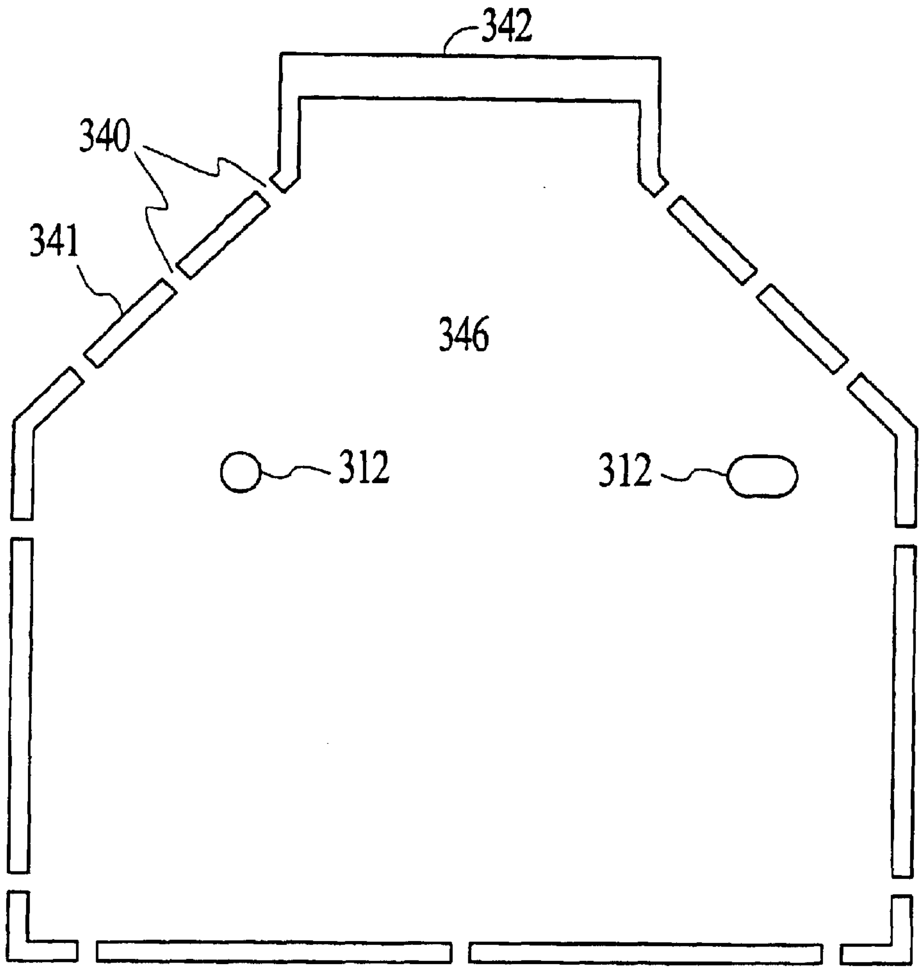
FIGS. 15A and 15B are diagrams illustrated laser cutting of contact devices in accordance with preferred embodiments of the present invention.

Preferred methods of cutting the fingers and outlines of probe members 310 will now be described with reference to FIGS. 15A and 15B. FIG. 15A illustrates a preferred area map for laser cutting of one illustrative probe member 346. The laser preferably cuts "stitched" perimeter cuts 341, with some material 340 remaining between stitch cuts 341. Stitch cuts 341 generally define the outline of probe member 346, with material remaining in order to provide support to probe member 346 during the remaining laser cutting processes. It should be noted that all laser cutting of probe member 346 preferably overlays open areas or indentations 326 on chuck 332, as previously described.

In the conductor run tip portion of probe member 346, area 342 is cut in order to provide a suitable laser track for cutting the fingers of probe member 346, as will be explained further hereinafter. In addition, guide pin holes 312 also are preferably cut in probe member 346, with guide pin holes 312 (one of which preferably is elongated), available to serve as physical positional references for probe member 346 in a final contact device (assuming that the final contact device is mechanically constructed to take advantage of such guide pin holes). The positional location of guide pin holes 312 preferably is provided by the same data file that provides the positional data for the laser cutting tracks.

Figure 15B:
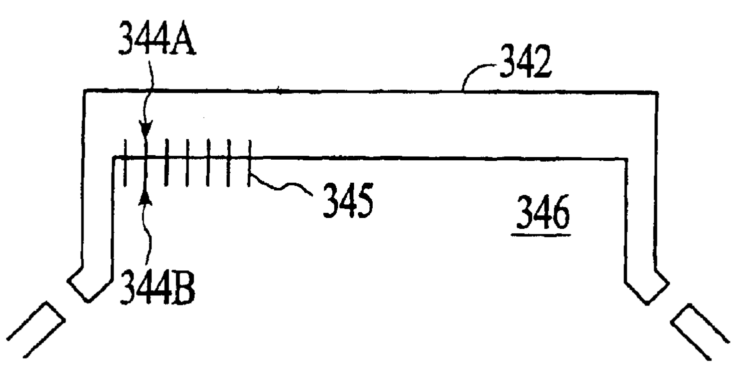

FIG. 15B illustrates preferred embodiments of laser cutting methods in accordance with the present invention. A plurality of laser cutting tracks 345 are illustrated. Preferably, the laser is directed at first end 344A of a laser track 345, which is positioned in the open area 342 previously cut by the laser. This enables the early laser pulses, which may be less stable, to be directed at an open area and not at the sensitive finger portion of probe member 346. Thereafter, the laser positioning and motion systems steps the laser towards second end 344B of the laser track. Preferably, laser cutting along tracks 345 proceeds from first 344A to second end 344B, but not in the opposite direction. It has been determined that a cut from end 344A to 344B and a return cut from 344B to 344A may impart an excess of laser energy at the portion of the laser track at end 344B, which may result in an enlarged or "keyhole" type opening at end 344B, which may undesirably weaken the finger portion of probe member 346 at this location. Alternatively, such return cuts may be performed with a return cut from end 344B to end 344A, but with the laser energy (either pulse rate or energy density) reduced near end 344B to avoid an enlarged keyhole type opening. Laser cutting from 344A to 344B proceeds until the entire thickness of substrate 300 is traversed.

In certain preferred embodiments, each of the fingers of the tip portion of probe member 346 is cut with the laser until the cut is all of the way through the material of substrate 300. In other preferred embodiments, a single pass (or other predetermined number of passes) from 344A to 344B for a finger is made and then stepped to the adjacent finger along the length of the tip portion. Without being bound by theory, stepping from finger to finger may allow heat to dissipate more optimally as compared to repeated cutting on the same finger until the cut is complete.

It should be noted that chuck 332 in conjunction with substrate 300 may be advantageously utilized in accordance with embodiments of the present invention to produce suitably fine and accurate slitting for probe members. Chuck 332 serves to provide a desirous pull down vacuum close, such as within 0.030 inches, to where most of the laser cutting occurs, while enabling laser cutting to occur over open indentations 326 of chuck 332. This enables the material of substrate 300 to be maintained in a more desirous flat condition on chuck 332 during laser cutting with vacuum pull-down, while allowing dross and debris of the laser cutting to fall into an open area of chuck 332. It also should be noted that the machining to produce chuck 332 may desirably be conducted by a CAD/CAM system, with the positional and other reference data for the CAD/CAM system for producing chuck 332 generated as a part of, or in an automated step subsequent to, the design process that created the data for probe members 310 of substrate 300.

Also in accordance with preferred embodiments of the present invention, lasers are used with particular properties that have been determined to be particularly useful for making contact devices as disclosed herein. In accordance with such preferred embodiments, the laser is selected and controlled to provide energy of a wavelength less than about 400 nm. While YAG lasers have been applied in a variety of applications, it has been determined that a Nd:YAG laser operating at the fourth harmonic, or about 266 nm, provides particularly good results, particularly when applied with a pulse duration of less than, or about 25 nanoseconds, and preferably between about 15–25 nanoseconds, with energy per pulse of about 200 microjoules, at a laser pulse rate of about 1000 Hz, or between 500 and 2000 Hz, or between 750 and 1500 Hz, and more preferably between 800 and 1200 Hz. With materials and other parameters selected in accordance with embodiments of the present invention, a cutting velocity of about 5 mm/second has been determined to provide desirable results.

Additional laser cutting parameters and methodologies determined to be particularly advantageous in accordance with additional preferred embodiments of the present invention will now be described.

As for wavelength, wavelengths shorter than 400 nm have been determined to be preferable in such certain preferred embodiments. Longer wavelengths have been determined to in general produce more burning and less ablation. In addition, the heat affected zone (HAZ) tends to be larger to the point of damaging material necessary for the probe mechanical properties and electrical properties to perform in the desired manner. On the other hand, wavelengths much longer than 200 nm also may be undesirable. Shorter wavelengths are believed to typically not contain enough energy to do the necessary ablation in order to produce slitting.

As for pulse width, in such certain preferred embodiments pulse widths are controlled to be shorter than 30 nanoseconds. Longer pulse widths tend to either contain more energy than the material can dissipate and negatively affect the HAZ, or if the energy is reduced, there may be insufficient peak power to cause ablation. Pulse widths longer than 5 nanoseconds are preferably used in such embodiments. Shorter pulse widths typically do not contain enough energy to cause ablation, or ablate at such a slow rate as to become inefficient.

As for velocity, velocities faster than ¼ of the laser beam diameter per pulse is preferably used in such embodiments. Slower velocities tend to increase the energy absorbed per unit area to the point that the HAZ becomes large enough to negatively impact the mechanical and electrical properties of the probe member. Velocities preferably are controlled to be slower than 1 beam diameter per pulse. Faster pulse rates are believed to leave material between pulse hits that do not see energy and do not produce proper slit formation.

As for energy per pulse, in such embodiments the energy per pulse preferably is more than about 25 micro-joules. Lower energies per pulse are believed not to contain enough energy to cause sufficient ablation for effective slit production. In such embodiments, the energy per pulse preferably is controlled to be less than 300 microjoules. Higher energies tend to not be absorbed by the material without increasing the HAZ so that it becomes large enough to negatively impact the mechanical and electrical properties of the probe member.

As for pulse rate, in such embodiments the pulse rate preferably is controlled to be faster than 500 Hertz. Slower pulse rates have been determined to reduce the production rate of the laser system to the point that the slitting process becomes overly expensive. On the other hand, in such embodiments that pulse rate preferably also is controlled to be slower than 2000 Hertz. Faster pulse rates are believed to either not contain enough energy per pulse to effectively ablate material or they exceed the material's capacity to remove heat to the point that the HAZ becomes large enough to negatively impact the mechanical and electrical properties of the probe member.

In accordance with preferred embodiments of the present invention, slit width also may be desirably controlled. In such preferred embodiments, the maximum slit width is controlled to be about 10 microns, as wider slit widths have been determined to consume significant area and limit the pitch of the probe member to approximately 100 microns due the need for area to allow for HAZ, position errors, signal path, etc. On the other hand, in such preferred embodiments the minimum slit width is controlled to be about 1 micron. Narrower slit widths have been determined to cause increased risk of undesirable bridging and mechanical crosstalk due to contact between adjacent probe fingers.

An additional improvement to laser cutting methodologies in accordance with certain preferred embodiments of the present invention will be described with reference to FIG. 16.

Figure 16:
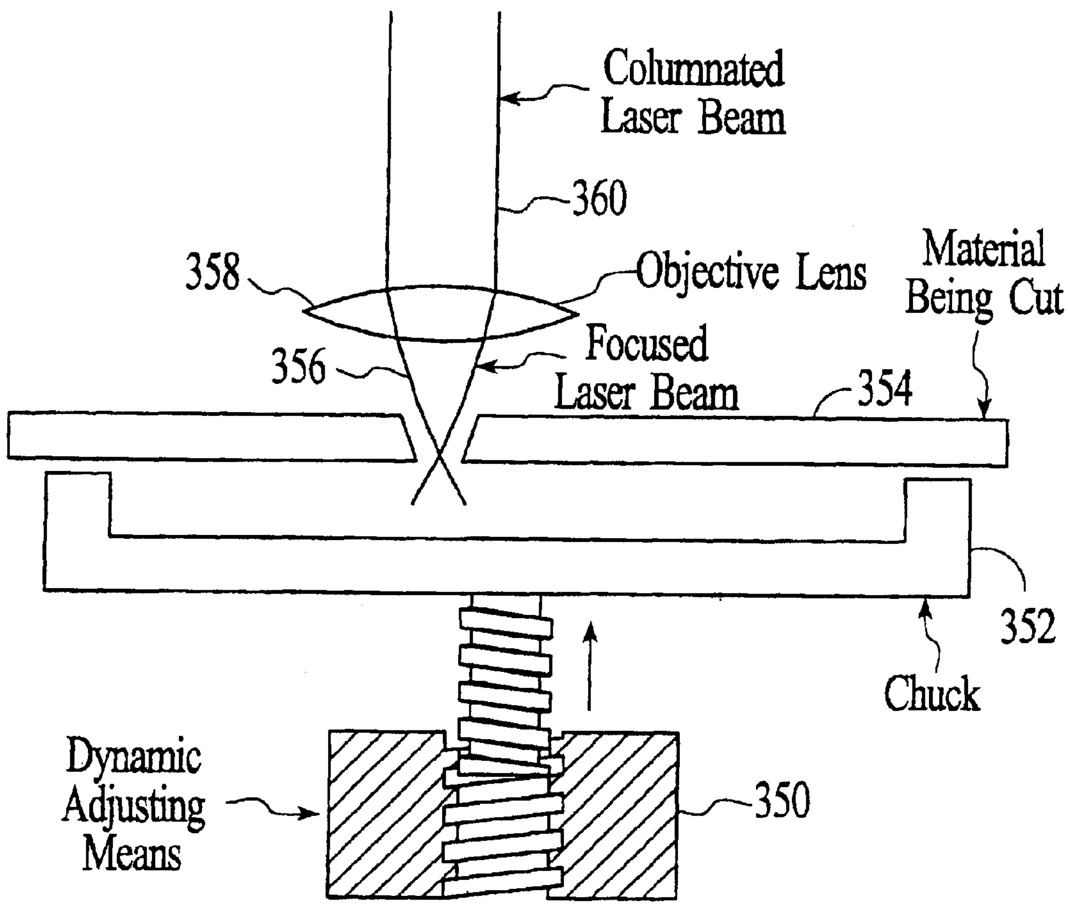
FIG. 16 is a diagram illustrating an embodiment of the present invention in which dynamic adjustment of the probe member in relation to a focused laser beam is provided.

FIG. 16 illustrates laser beam 360 being directed onto probe member 354, such as for cutting slits between finger, such as described elsewhere herein. In this embodiment, probe member 354 is positioned on chuck 352, which is positioned on elevation mechanism 350, which may be considered a "Z dimension" stage. Laser beam 360 is focused more towards a point by lens 358 to produce focused beam 356. With the minimum spot size in general being a fixed length from lens 358, in this embodiment a cutting pass (or passes) is made in a particular area of probe member 354. As the cut becomes deeper, elevation mechanism 350 adjusts chuck 352 and probe member 354 upwards. As a result of the upward movement of probe member 354, the material that is to be cut by a subsequent pass of focused laser beam 356 may once again be with a more minimal beam size. Without such upward movement, the beam becomes in effect over-focused as the cut becomes deeper, leading to a less focused and undesirably wider spot size, which makes it difficult to achieve fine slitting.

With such embodiments, the laser beam is more focused into a spot such that the energy density is high enough to change the material of the probe member into a form in which it is removed from the probe member, leaving the desired material intact. As the beam spot size is a significant contributor to the kerf width of the material removed, dynamically adjusting the position of the probe member to maintain a more focused beam at the point of beam impact can significantly reduce the kerf width. In other embodiments, the position of the probe member is maintained constant, while the position of lens 358 is adjusted. What is important is that the relative position of lens 358 and probe member 354 is adjusted (dynamically) during a cutting pass, or between cutting passes, so that only a highly focused and small laser beam spot impinges upon the material to be removed.

Additional improvements and advantages of contact devices and probes in accordance with embodiments of the present invention will now be described.

Figure 17:
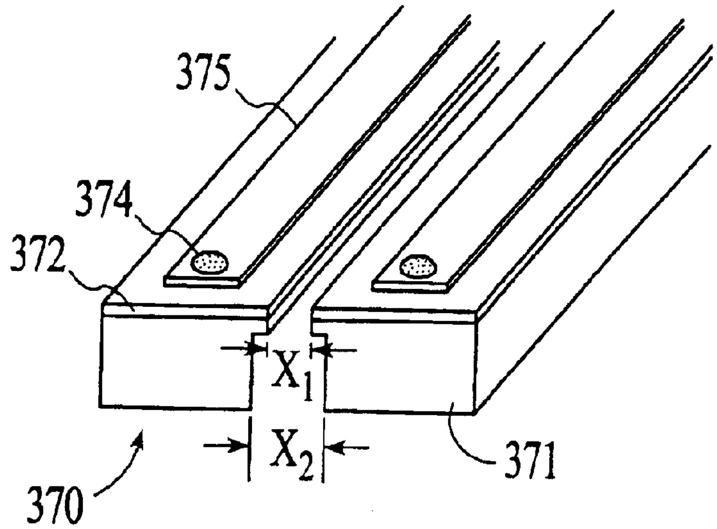
FIGS. 17 and 18 illustrate probe members fabricated in accordance with alternate preferred embodiments utilizing a two phase type laser cutting process.
Figure 18:
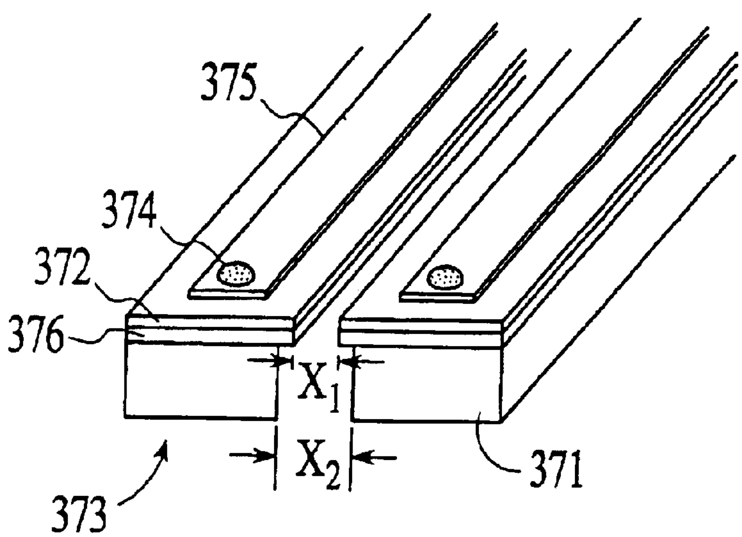

Referring now to FIGS. 17 and 18, certain additional preferred embodiments of laser cutting in accordance with the present invention will now be described. As illustrated in FIG. 17, laser cutting may be performed in two phases, each of which may be conducted in one or more separate passes. Two fingers of probe member 370 are illustrated for discussion purposes. Each finger of probe member 370 includes conductive lower layer 371, on which is formed dielectric layer 372 and conductor runs 375 having contact bumps 374. The structure of and method of forming the fingers of probe member 370 may be as described elsewhere herein.

In this embodiment, laser cutting is first conducted from the back side of probe member 370, or the side opposite the side on which conductor runs 375 are formed. Laser cutting proceeds with one or more passes with a less controlled width, such as width $X_2$ as illustrated. The laser cutting of this phase may be a rougher, higher energy and perhaps faster cut phase. With the cutting being conducted from the back side, control of the cut is less important. The cutting of this first phase goes to a depth less than the thickness of conductive lower layer 371, which be achieved by way of measuring the depth of the cut or by experimentation with particular laser parameters and materials. What is important is that the first phase of laser cutting be conducted from the back side of probe member 370 and not completely cut through the finger.

In a second phase, the laser cutting is now conducted from the front side of probe member 370 (or the side on which conductor runs 375 are formed), with a highly focused, high energy and relatively small beam spot. Preferably, the cutting from the front side of probe member 370 is achieved with a side pass that completes the cutting through the probe member. Preferably, the front side cut has a smaller width, illustrated as width $X_1$. With the cutting from the front side occurring in a single or very few passes, the amount of debris or dross depositing on the front side of probe member 370 may be minimized.

FIG. 18 illustrates a refinement of the two step laser cutting approach discussed in connection with FIG. 17. In the embodiment of FIG. 18, probe member 373 includes layer 376 formed on conductive lower layer 371. Dielectric layer 372 is formed on layer 376, and conductor runs 375 having contact bumps 374 are formed on dielectric layer 372. The constituent materials of layer 376 are selected based on the particular laser that is selected for the cutting operation. Layer 376 preferably is highly reflective or otherwise non-absorbing of the laser beam, and serves as an "etch stop" or inhibiting layer to ensure that the first phase, back side laser cutting does not cut entirely through probe member 373. In the second phase laser cutting, again conducted from the front side of probe member 373, the laser cutting is again conducted with a highly focused, high energy and relatively small beam spot. Preferably, the cutting from the front side of probe member 370 is achieved with a single pass that completes the cutting through the probe member. Preferably, the front side cut has a smaller width than the back side cut, as discussed in connection with FIG. 17. The front side cut may be conducted with a laser beam of different parameters in order to more readily remove the material of layer 376, etc. As before, with the cutting from the front side occurring all in a single or very few passes, the amount of debris or dross depositing on the front side of probe member 373 may be minimized.

Probe members in accordance with the present invention may be formed with very small width and fine pitch. As a result, improved contact probe structures may be achieved.

Figure 19:
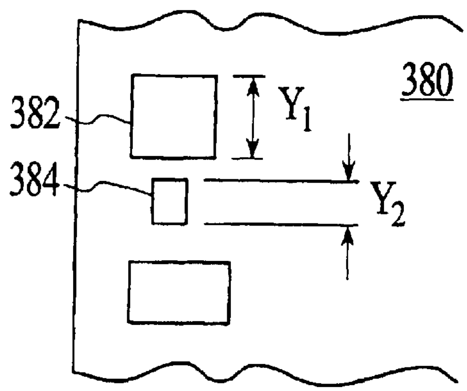
FIG. 19 illustrates contact points or pads of an electronic device in accordance with alternative embodiments of the present invention.

Referring to FIG. 19, a portion of electronic device 380 is illustrated having contact pads 382 and 384. Preferably electronic device 380 has contact pads of two different sizes, illustrated as dimensions $Y_1$ and $Y_2$. Due to the ability to make very fine pitch devices, such as devices with fingers on a 40 or below 40 micron pitch, with slits of about 2 or about 1–3 microns, it is possible to have additional test only contact pads positioned on electronic device 380 that are small and consume little surface area. Larger contact pads such as pads 382 also may be probed with the contact device, with the larger contact pads also serving as bonding pads (the larger area of pads 382 provide sufficient area for wire or other bonding in the device packaging process). Smaller pads 384 are provided only for testing purposes and may be of a size not suitable for serving as a bonding pad. Such additional probe-test-only pads, more test contact points may be provided, which may serve to provide parallel or otherwise more efficient testing of electronic device 380.

Figure 20:
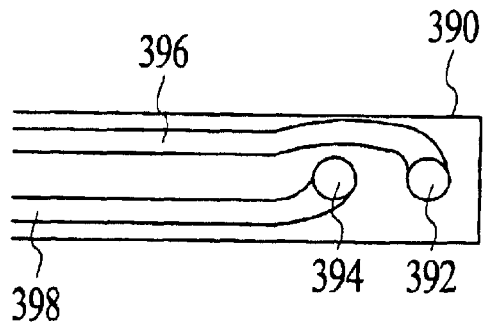
FIGS. 20 to 22 illustrate electronic devices and probe members having or utilizing probe members with multiple contacts per finger.
Figure 21:
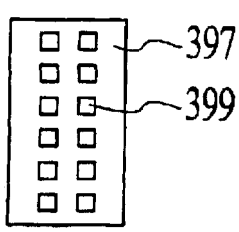

Referring now to FIGS. 20 and 21, additional embodiments of the present invention will be described. As illustrated, electronic device 397, which may be a high density memory device such as a 64M DRAM, is provided to have two rows of bonding or contact pads 399 positioned in a center portion of electronic device 397. Such a device structure may be what is known as a lead-on-chip (or LOC) configuration, with a lead frame (not expressly shown) secured to a front face of electronic device 397 with, for example, an insulative adhesive, with bonding wires extending from pads 399 to connection points of the lead frame.

In wafer probing of such a device, as illustrated in FIG. 20, fingers 390 of the contact device may include two contact bumps, front bump 392 and back bump 394, and two conductor runs 396 and 398. As illustrated, conductor runs 396 and 398 proceed substantially in parallel down the length of finger 390, with conductor run 396 extending around back contact bump 394 in order to make electrical contact to contact bump 392. With such a contact device structure, a single finger may contact a pair of the contact pads illustrated in FIG. 21. It is possible to extend this concept to three, four or more contacts and conductor runs per finger, with the contacts three in a row, or a two-by-two array, etc.

Figure 22:
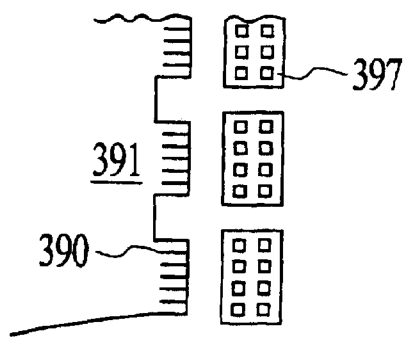

In addition, contact devices of this structure may be extended to probing multiple electronic devices 397 with a single contact device 391, as illustrated in FIG. 22. As illustrated, contact device 391 has a plurality of fingers 390 arranged in a manner to contact multiple electronic devices 397. As with the contact device of FIG. 20, if electronic devices 397 include two rows of contact pads 399, then fingers 390 may include two contact bumps. In such a manner, a single contact device 391 may be used to wafer probe a plurality (e.g., 4, 8, 16, etc.) of electronic devices 397. It should be understood that the embodiment of FIG. 22 may include the ability to wafer test electronic devices 397 having a single row of contact pads 399, or two rows of contact pads 399 (such as illustrated in FIG. 21), or three or four rows of contact pads 399, with fingers 390 having a suitable corresponding number of contact pads and conductor runs. Still alternatively, two contact devices may be provided to probe devices 397 from opposite sides, with each contact device probing one, two, three, four, etc. rows of contact pads on the electronic devices.

Figure 23:
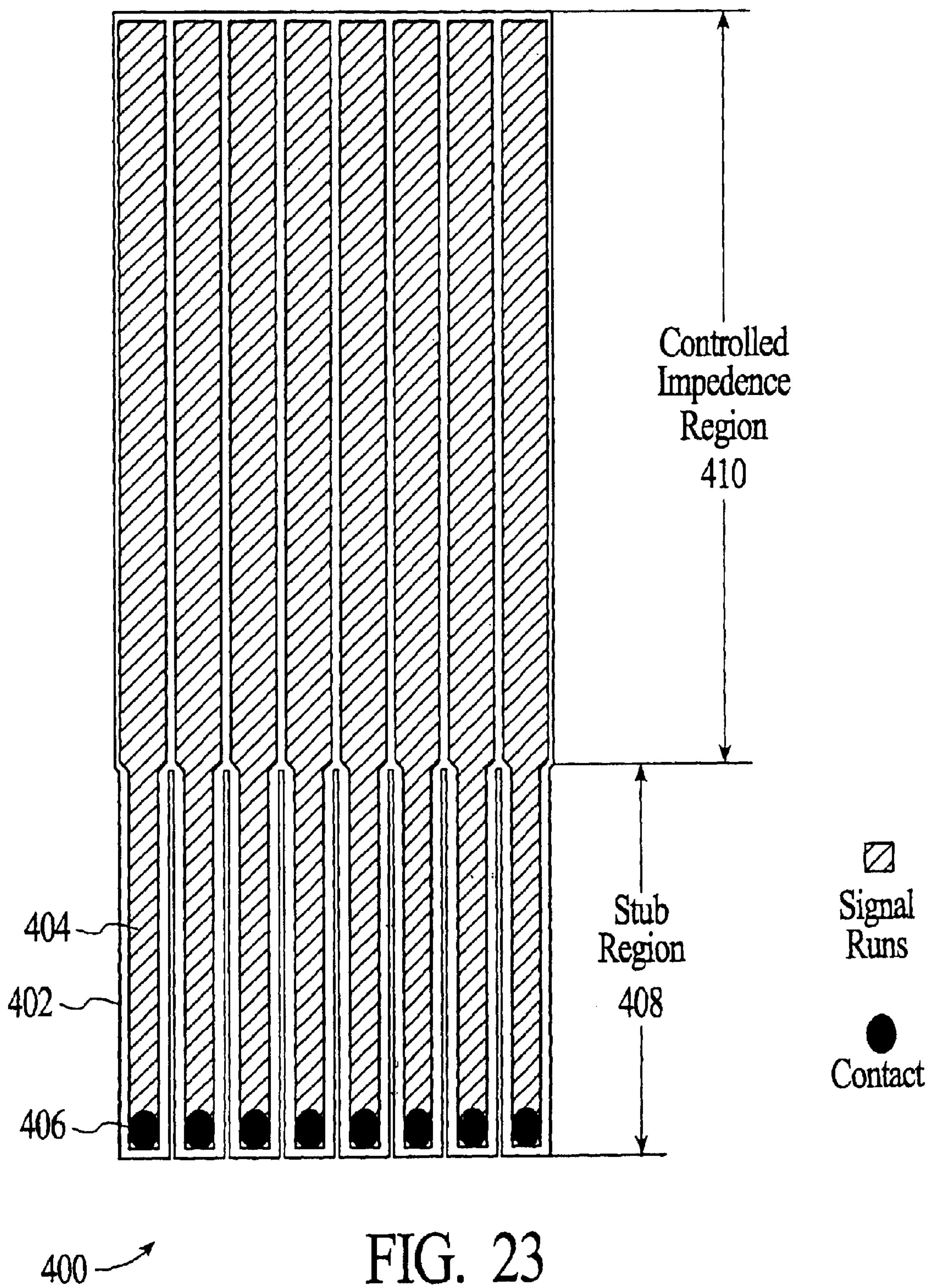
FIG. 23 is a diagram illustrating a portion of a probe member having a controlled impedance region and a stubb region.

Referring now to FIG. 23, an improved structure of a contact device of fine pitch will now be described. As illustrated, a portion of contact device 400 includes a plurality of fingers 402, on which are formed conductor runs 404, each of which has a contact bump 406 formed on a contact end thereof. Contact device 400 may be formed in a manner as described elsewhere herein. In this preferred embodiment, contact device 400 is formed to have at least two distinct regions, controlled impedance region 410 and stub region 408.

Unlike conventional approaches in which it is desired to maintain a controlled impedance to the contact point for optimum signal propagation characteristics, this embodiment compromises the signal propagation characteristics in stubb region 408, while maintaining a desired controlled impedance in controlled impedance region 410. As an illustrative example, the controlled impedance may be desirably 50 ohms. Controlling the 50 ohm signal environment the entire length of fingers 402, however, will impose a limit on how fine a pitch may be achieved. Deviating from the 50 ohm environment in stubb region 408 may enable more area for slitting between fingers 402 as illustrated, thereby enabling finer pitch contact devices.

It should be noted that stubb region 408 desirably is limited to substantially less than the wavelength of any signals of interest. For example, the length of stubb region 408 should be less than about ¼ or ⅛ of the wavelength of the highest frequency signals of interest, and more preferably less than about 1/10 of the wavelength of the highest frequency signals of interest. As illustrated, with the conductor run narrowed only in the limited length of the stubb region (e.g., about 0.050 inches or less), fine pitch contact devices with suitable frequency transmission characteristics may be desirably achieved.

It should be noted that the embodiment of FIG. 23 may be applied to both microstrip or stripline configurations.

Still further improved contact device structures in accordance with other preferred embodiments of the present invention will be described with reference to FIGS. 24A to 24C.

It has been determined that certain contact devices exhibit non-uniform scrub characteristics. As a for example, certain contact devices tend to exhibit less scrub for the fingers at the ends of the row of fingers. It in general is desirable to have more uniform scrub characteristics for all of the fingers of the row of fingers.

Figure 24A:
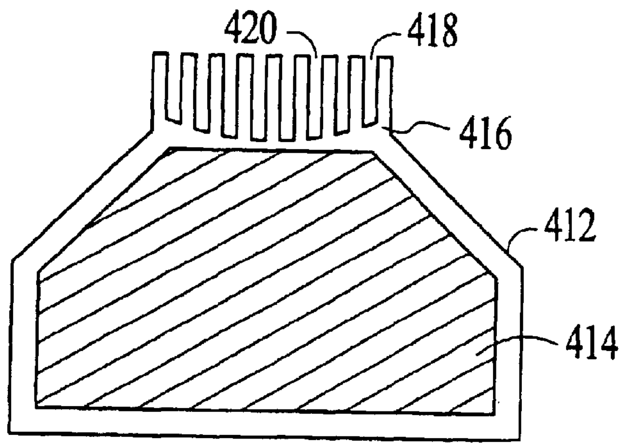
FIGS. 24A to 24C illustrate improved contact devices in which more uniform scrub characteristics may be obtained.

In FIG. 24A, a contact device having non-uniform slit lengths is provided. As illustrated, contact device 412, which preferably includes mechanical ground 414 such as previously described, includes a plurality of fingers in the tip region 416. As illustrated, fingers near the end of the rows of fingers have a different slit length from slits between fingers in the center portion of the row of fingers. Preferably, fingers near the end of the row have a slit, such as slit 418, that is shorter than the slits between fingers in the center portion, such as slit 420. With slits near the end of the row of a different (preferably shorter) length, a more uniform scrub characteristic may be obtained in certain embodiments.

Figure 24B:
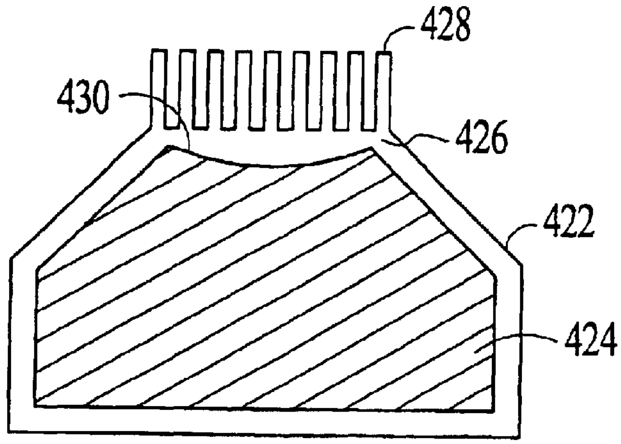

In FIG. 24B, a contact device having a varying or non-uniform mechanical ground 424 is provided. As illustrated, contact device 422 includes mechanical ground 424 with extending portions near the end region 430 adjacent to the end of the row of fingers. In this embodiment, fingers 428 in the tip region 426 of contact device 422 may be of the same length, while a non-uniform mechanical ground alters the stress sharing characteristics of the fingers near the end of the row of fingers as compared to fingers in the center portion of the row of fingers. Preferably, mechanical ground 424 provides a mechanical ground contact point nearer the base of fingers 428 for those fingers located near the end of the row of fingers. Still preferably, the mechanical ground may be provided in a manner to gradually vary from the end region 430 of mechanical ground 424 to a center portion of the mechanical ground. With a varying or non-uniform mechanical ground, a more uniform scrub characteristic may be obtained in certain embodiments.

Figure 24C:
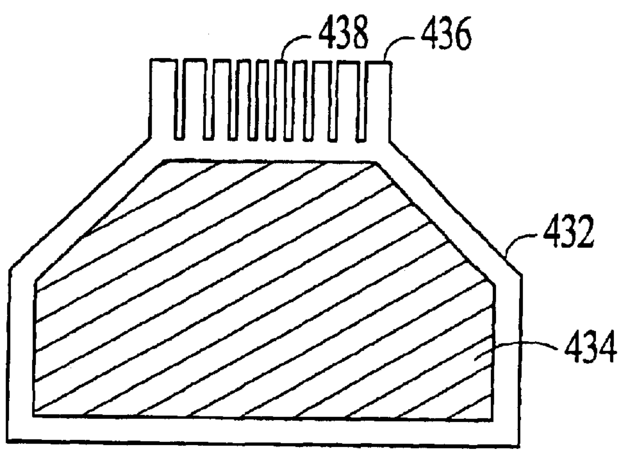

In FIG. 24C, a contact device having a varying or non-uniform finger width is provided. As illustrated, contact device 432 includes mechanical ground 434 and a plurality of fingers (e.g., fingers 436 and 438). Fingers near the end of the row of fingers (e.g., finger 436) is of a width greater than a finger near the center portion of the row of fingers (e.g., finger 438). With a varying or non-uniform finger width, a more uniform scrub characteristic may be obtained in certain embodiments.

Further improved contact probe structures in accordance with additional preferred embodiments of the present invention will now be described with reference to FIGS. 25A to 25D. As illustrated in these embodiments, two (and perhaps more than two) contact bumps 446 and conductor runs 444 are provided for each finger 441. Conductor runs 444 are provided on dielectric 442, which is formed on conductor layer 440, such as in a manner described elsewhere herein.

In the illustrated embodiments, one or more partial slits 448 are provided in the back side opposite the side where conductor runs 444 are formed. When multiple conductor runs are formed on a single finger, the fingers, being torsionally stiff, may not be sufficiently compliant to accommodate height variations that may be encountered between contact pads of the electronic device to be tested. Through micromachining such as with a laser, partial slits may be formed in the back side of the fingers to increase the torsional compliance.

Figure 25A:
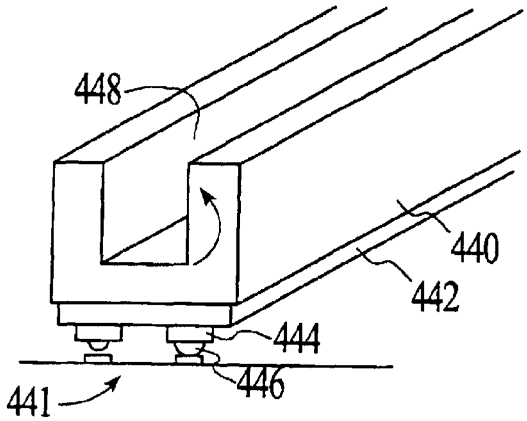
FIGS. 25A to 25D illustrates fingers of a probe having multiple contacts per finger and partial compliance slits formed in a back side of the finger.
Figure 25B:
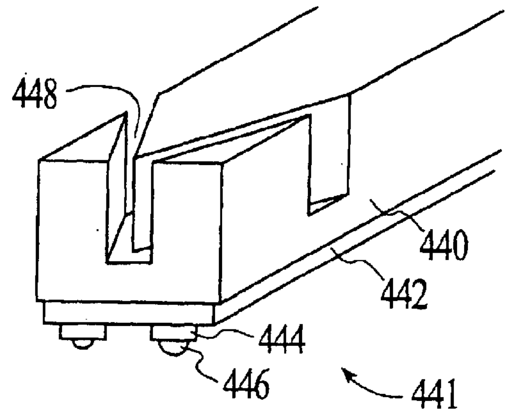
Figure 25C:
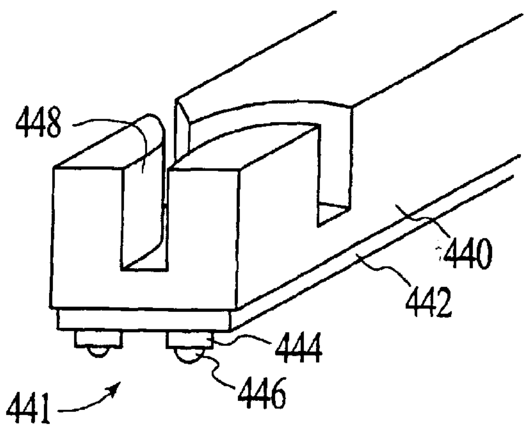
Figure 25D:
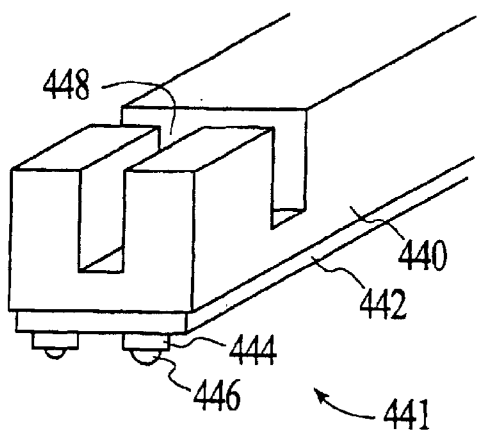

FIG. 25A illustrates compliance slit 448 extending substantially in parallel to the length of finger 441. The arrow indicates a torsional moment created during an exemplary non-uniform contact. FIG. 25B illustrates compliance slit 448 having two portions, each extending from a center portion of the end of finger 441 to a point along the length of finger 441. FIG. 25C illustrates compliance slit 448 having two curved portions, each extending from a center portion of the end of finger 441 to a point along the length of finger 441. FIG. 25D illustrates compliance slit 448 extending initially in parallel to the length of finger 441 for a predetermined length, and then perpendicularly to the length of finger 441 in the shape of a "T." With such compliance slits, a contact device with two or more contact bumps and conductor runs per finger with improved compliance may be obtained.

Still other improved methods of producing contact devices, and improved methods of producing electronic devices using such contact devices, will now be described.

In accordance with contact devices as described elsewhere herein, and also with techniques known as probe cards, using fine needles or wires, membrane contact devices utilizing a membrane having conductors and connection points on a membrane which typically is pulled down over an elastomer (e.g., a truncated pyramid) (such as produced by Cascade Microtech Inc.) and then contacted with the DUT and other contact devices such contacts appended to microsprings/bonding wires (such as produced by Formfactor, Inc.), construction of such contact devices typically has been way of separate construction based on physical data provided in physical form (e.g., written or electronic numbers such as physical coordinates, etc.), which are then using to construct the contact device. Such a manner of manufacturing contact devices has disadvantages, such as requiring excessive manual intervention, for example manual entry of contact location and the like into a tool for machining or otherwise fabricating the contact device. Such techniques are inefficient to some degree and enable the introduction of errors and the like, and improved methods are desirable for both the end device manufacturer and the manufacturer of the contact device. In addition, many such conventional techniques have been limited in that the conductors for the contact device are offered in a single or limited set of electrical characteristics (e.g., all needles having in effect the same size and overall electrical characteristics, etc.), when in reality conductors for the contact device more desirably would have electrical or physical characteristics more correspondingly optimized vis-a-vis the electronic device being tested.

The present invention provides methods for manufacturing such contact devices for making connection to an electronic circuit device and methods of using the same in the production of integrated circuits, liquid crystal displays or other electronic devices. In accordance with the present invention, the manufacturing of the contact device and the electronic device is more tightly integrated, thereby enabling more efficient manufacturing of the contact device, and thereby enabling more effective input by the electronic device designer/manufacturer into properties of the contact device, and smaller and more highly integrated electronic devices.

For purposes of understanding the present invention, it should be noted that, as device and pin/bonding pad geometries and dimensions of the electronic device become increasingly finer, leading, for example, to finer pitches and spacings, the physical area or real estate, particularly near the probe tip/finger areas (particularly with a structure such as disclosed in U.S. Pat. No. 5,621,333) becomes increasingly critical. It should be noted that the electronic device designer/manufacturer must try to achieve the greatest density possible, which thus leads to the smallest possible devices and/or the smallest possible pad spacings, which in turns controls the width of, and available area/real estate in, the probe tip/finger areas. In general, this trend has led to smaller probe tips/fingers, and finer conductor runs in these areas.

Unfortunately, however, this tends to compromise the contact device or probe performance in certain respects, as smaller conductor runs may lead to undesirable electrical characteristics. For example, conductor runs that are too narrow may result in increased resistance/impedance or heating, or simply an inability to carry the desired or required current level. Other leads, for example, may have minimal current or signal performance requirements. Thus, it may be desirable to have a wider conductor for power or ground leads, for example, even if this results in smaller conductors for other leads. It also may be desirable in certain applications to tailor the conductor runs for certain fingers to have a greater or lesser width, while adjusting the widths of other conductors accordingly. Other conductors, for example, may have minimal or maximal conductor widths and/or spacings due to the characteristics of the signals to be carried on such conductors. As physical area becomes more constrained, in general it can become important that conductors be arranged near the probe tip/finger areas in ways (in terms of size, spacing, etc.), that optimize the desired electrical characteristics.

In accordance with the present invention, such electronic devices, including those with electrical or physical characteristics of the contact device conductors selected or optimized by the designer or manufacturer of the electronic device, may be produced in a more optimized and efficient manner. It should be understood that the present invention is particularly well suited to produce contact devices or probes such as is disclosed in U.S. Pat. No. 5,621,333 and for the production of electronic devices such as integrated circuits, liquid crystal or other displays and other devices using contact devices having electrical contact points that are produced using photolithographic or other automated design and/or manufacturing techniques, although certain techniques of the present invention may be extended to other types of contact or probe devices, such as those described above.

In accordance with the present invention, more automated production of contact or probe devices, in whole or part, is implemented as part of the design process for the electronic device. In accordance with the present invention, physical characteristics of the contact device, such as physical size or geometry and the location and size of contact points, are specified as part of the electronic device design/manufacturing process. Through data entry or selection of contact device options presented to one or more designers of the electronic device, characteristics of the contact device are specified as part of the electronic device design/manufacturing process. Thereafter, data generated as part of the electronic device design/manufacturing process is provided to an automated tool for layout and/or manufacture of the contact device.

More preferably, the designer of the electronic device has the option to specify or select desired electrical characteristics of particular conductors on the contact device. In accordance with the present invention, the physical layout, including size, position and/or length of the fingers or conductors of the contact device or probe, may be more automatically generated. With probe or contact devices such as disclosed in U.S. Pat. No. 5,621,333 and the like, such a process may enable production of masks or patterns (such an electron beam or optical writing device) to generate the probe or contact device as a result of software processing of data generated by the electronic device design process. In particular, probes or contact devices having conductor characteristics, either physical or electrical, specified or selected by a designer of the electronic device may be more efficiently generated in a more automated manner, thereby enabling the ultimate manufacture of the electronic devices in a more efficient or optimized manner.

Figures 26A, 26B:
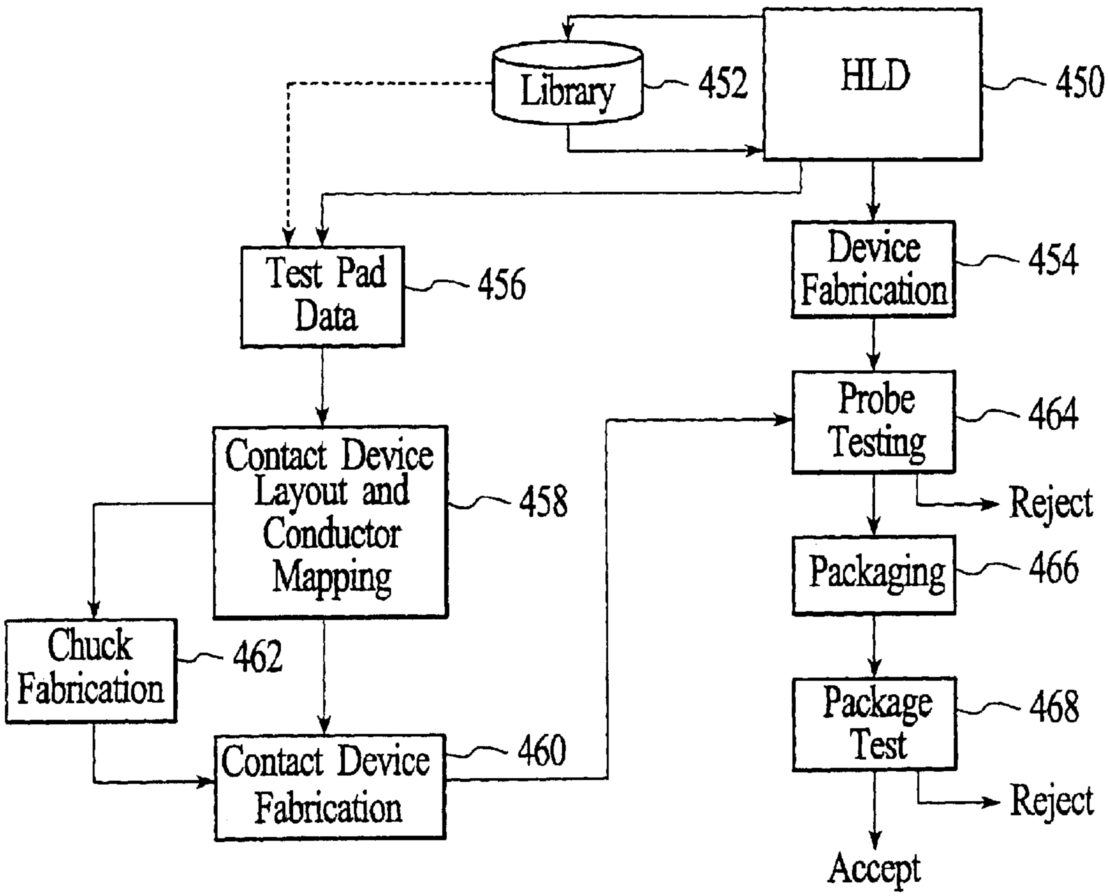
FIGS. 26A and 26B are diagrams illustrating an improved electronic device and contact design flow in accordance with certain preferred embodiments of the present invention.

Referring to FIG. 26A, a general design flow in accordance with certain preferred embodiments of the present invention is illustrated. At step 450, the device (e.g., integrated circuit, display or other electronic device having bonding pads or other conductor attachment points, etc.) is designed at a high level, as indicated by the box HLD, for high level design. The HLD step may be conducted using conventional-type electronic design tools. For example, at step 450 a designer may define desired input and output characteristics of the device being designed, and may determine various transfer function, logic or other electrical or signal characteristics of the device. For example, such design may be accomplished using VHDL, behavioral models or other analog and/or digital design characteristics. As a part of such HLD process, library 452 may be accessed. Library 452 may contain various libraries of circuit elements, modules or other design data to facilitate the HLD of the electronic device. In certain preferred embodiments, library 452 may contain or be able to access elements specifying physical or electrical characteristics or options available for contact points or conductor runs of the contact device.

Device fabrication is performed at step 454, it being understood that additional design verification steps may have occurred between step 450 and step 454 as part of the overall electronic device design process. For example, high level designs typically undergo simulation, layout, re-simulation and other design verification steps in order to debug to the extent possible the design of the electronic device prior to expending the resources for device fabrication. All such design steps are contemplated by the design flow of FIG. 26A. After device fabrication step 454, the devices, typically in wafer form, proceed to step 464 for probe testing.

A parallel design flow for contact device preparation is illustrated in FIG. 26A and is an important aspect of certain preferred embodiments of the present invention. As illustrated, the HLD design step 450 also entails generation of data suitable for use in design/fabricating the contact device. In certain preferred embodiments, at a HLD stage a designer may specify physical or electrical characteristics of the contact device. As illustrative examples, the designer may specify (or select, etc.) that certain contacts of the electronic device are power supply lines, non-critical level sensitive lines (such as chip select or status lines), or high frequency or frequency critical lines, etc. As certain contact devices as contemplated by the present invention enable the conductors and contacts to be more precisely tailored for the particular desired characteristics, having such characteristics selectable by a designer at a higher level point in the electronic device design cycle will enable more automated design tools to, for example, layout and map the conductors of the contact device. As for example, high frequency lines may be mapped to preserve a controlled impedance environment to a high degree, while power supply and/or ground conductors may be arranged or mapped to provide a larger current carrying capacity. Non-critical lines may be mapped in a less critical (e.g., smaller conductor form) manner in order to minimize area usage in critical areas. In addition, certain devices may specify an external impedance, such as a decoupling capacitor at a point close to the contact pads of the contact device (as described elsewhere herein). With such an automated design flow as illustrated in FIG. 26A, at a higher level point in the design cycle data specifying such an external impedance may be presented to tools for laying out and mapping the conductors of the contact device.

At step 456, a tool for generating and/or processing test pad or other data specifying or identifying characteristics of the contact points of the electronic device is utilized. Such a step may entail extracting contact point physical or electrical characteristics data corresponding to the electronic device, but preferably the tools of the HLD step for the electronic device present data specifying relevant desired physical and/or electrical characteristics of the contact device. What is important is that such data for purposes of preparing the contact device be made available, preferably in a more automated manner, to the design and fabrication flow for the contact device.

At step 458, a contact device tool lays out and/or maps conductors of the contact device. Such a tool preferably contemplates the type of tester or testers to be used to test the electronic device, and also makes use of any physical and/or electrical data specified or selected by the HLD process for the electronic device. With such a design flow, preparation of the contact device, including reflecting design data input from the electronic device design process, may be more readily conducted. With such a design flow, particular conductors of the contact device may be more readily tailored for the particular desired physical and/or electrical characteristics, preferably as specified or selected as part of the electronic device design process.

At step 460, based on data generated at step 458, the contact device is prepared. As illustrative examples, by way of steps 458 and 460, a layout and mapping of the conductors of the contact device is made, and photolithographic or similar masks are more automatically prepared or generated (such as by way of a mask shop) in order for the contact device to be prepared (illustrative steps to prepare such a contact device are described elsewhere herein).

As previously described, certain preferred fabrication processes of the contact device involve laser cutting with a chuck prepared for the laser cutting step. In an alternative design flow embodiment, data generated at step 458 for the contact device is more automatically generated in a form suitable for preparation of the chuck. As previously described, a DXF or other suitable data format file may be created in order to facilitate the machining or other preparation of a chuck or other implement for producing the contact device (e.g., a fine pitch, fine slit contact device, for which precise laser cutting is desired, etc.).

At step 460, the contact device is fabricated. At step 464, probe testing of the electronic devices may be accomplished, preferably at a wafer, unpackaged level. Tested devices may be rejected and identified as rejected (such as by inking or tracking with a computer), and electronic devices passing the probe testing step may proceed to device packaging step 466. At step 466, the wafers may be diced into chips, for example, with chips encapsulated and packaged, such as with wire bonding, etc., and packaged in a resin or ceramic or other package. Thereafter, packaged devices may undergo additional testing at step 468, with the device either rejected or accepted. Accepted devices may then be prepared for use in a system design, prepared for inventorying, shipment, sales, etc.

Referring to FIG. 26B, exemplary data format 470 is illustrated. To facilitate the design flow depicted in FIG. 26B for the contact device, at step 450 and/or step 456 (or other suitable point in the contact device design flow), electronically stored parameters for the contact points of the contact device are generated and/or processed. As illustrative examples, coordinate-type location data for particular contact points may be provided, along with a unique identifier or name for the pad or contact point. Preferably, pad or contact data is provided, which may specify the type of signals to be transmitted through the pad (e.g., power supply or ground, high frequency signal transmission, etc.) and/or other suitable data by which particular physical or electrical characteristics of the contact point of the contact device may be determined. Such pad data may be generated as a result of a designer of the electronic device specifying or selecting options presented as a part or, or in conjunction with, HLD step 450. Still preferably, in certain embodiments tester channel or other suitable data identifying channels or other characteristics of the tester to be used to test the electronic device is provided.

The format of FIG. 26B is exemplary only; what is important is that the design flow of the electronic device contemplate the design flow of the contact device, and present data to the contact device design flow in a suitable and more automated electronic format. Preferably, a person involved in the HLD process of the electronic device specify or select parameters of the contact device, so that conductors of the contact device may be laid out or mapped based on the desired physical and/or electrical characteristics of the particular conductors, which may include laying out the contact device so that external impedances may be provided at a desirable point on the contact device (e.g., a decoupling capacitor or other external impedance at a point close to which the contact device contacts the electronic device, etc.).

In accordance with such embodiments, improved processes for manufacturing electronic devices may be developed. For example, methods in accordance with such embodiments may include the steps of: generating a design description of the electronic device using a computer aided design tool; electronically determining physical device data representing a physical description of the electronic device based on the design description, wherein the physical device data includes data defining connection points for connecting the electronic device to external circuits; producing a physical embodiment of the electronic device in accordance with the physical device data; electronically determining physical test member data representing conductors and contact points of a test member for testing the electronic device; producing the test member in accordance with the test member data; engaging the test member with the electronic device, wherein contact points of the test member engage connection points of the electronic device, wherein stimulus and response instruments apply test signals to the electronic device through the test member and receive signals from the electronic device, wherein the stimulus and response instruments determine whether the electronic device is defective. Refinements of such methods may include: the physical device data includes data identifying one or more connection points of the electronic device and also includes signal data indicative of electrical signal characteristics of signals to be conducted through the one or more connection points; the step of electronically determining physical test member data includes determining physical characteristics of conductors of the test member in accordance with the signal data; the width of one or more of the conductors is determined in accordance with the signal data; the spacing of one or more of the conductors in determined in accordance with the signal data; the width and spacing of one or more of the conductors is determined in accordance with the signal data; the physical characteristics of a first conductor is determined at a first step, wherein the physical characteristics of a second conductor is determined at a second step, wherein the physical characteristics of the second conductor are determined based on the signal data and/or the physical characteristics of the first conductor; the first conductor is determined to have a first width, wherein the second conductor is determined to have a second width, wherein the first width is greater than the second width; the conductors include one or more third conductors, wherein the one or more third conductors are determined to have a third width; the third width is intermediate to the first and second widths; the width and spacing of the conductors is determined in accordance with the signal data, wherein the width and spacing of the conductors is determined in an iterative manner depending upon signal data of one or more of the conductors; and/or the width and spacing of the conductors is physically mapped in accordance with the signal data.

Additional preferred embodiments of the present invention in which multiple electronic devices, or arrays of contacts on one or more electronic devices, may be simultaneously probed will be described with reference to FIGS. 27 and 28.

Figure 27:
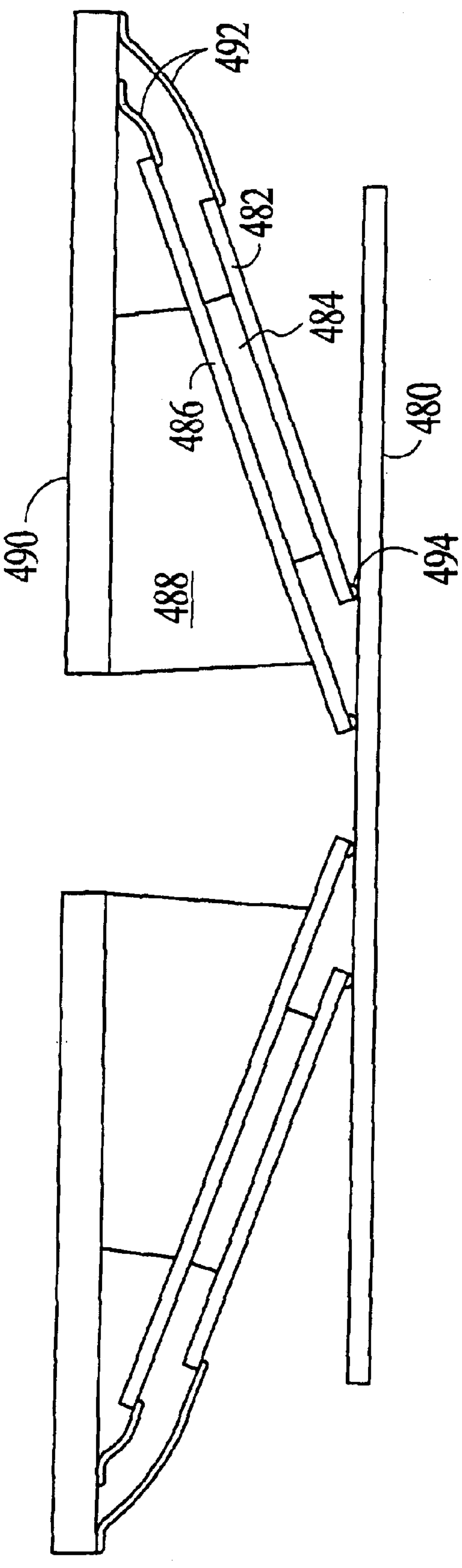
FIGS. 27 and 28 illustrate a configuration of probe members to produce a contact device for probing multiple electronic devices or an array of contacts, and an exemplary use of such a contact device.
Figure 28:
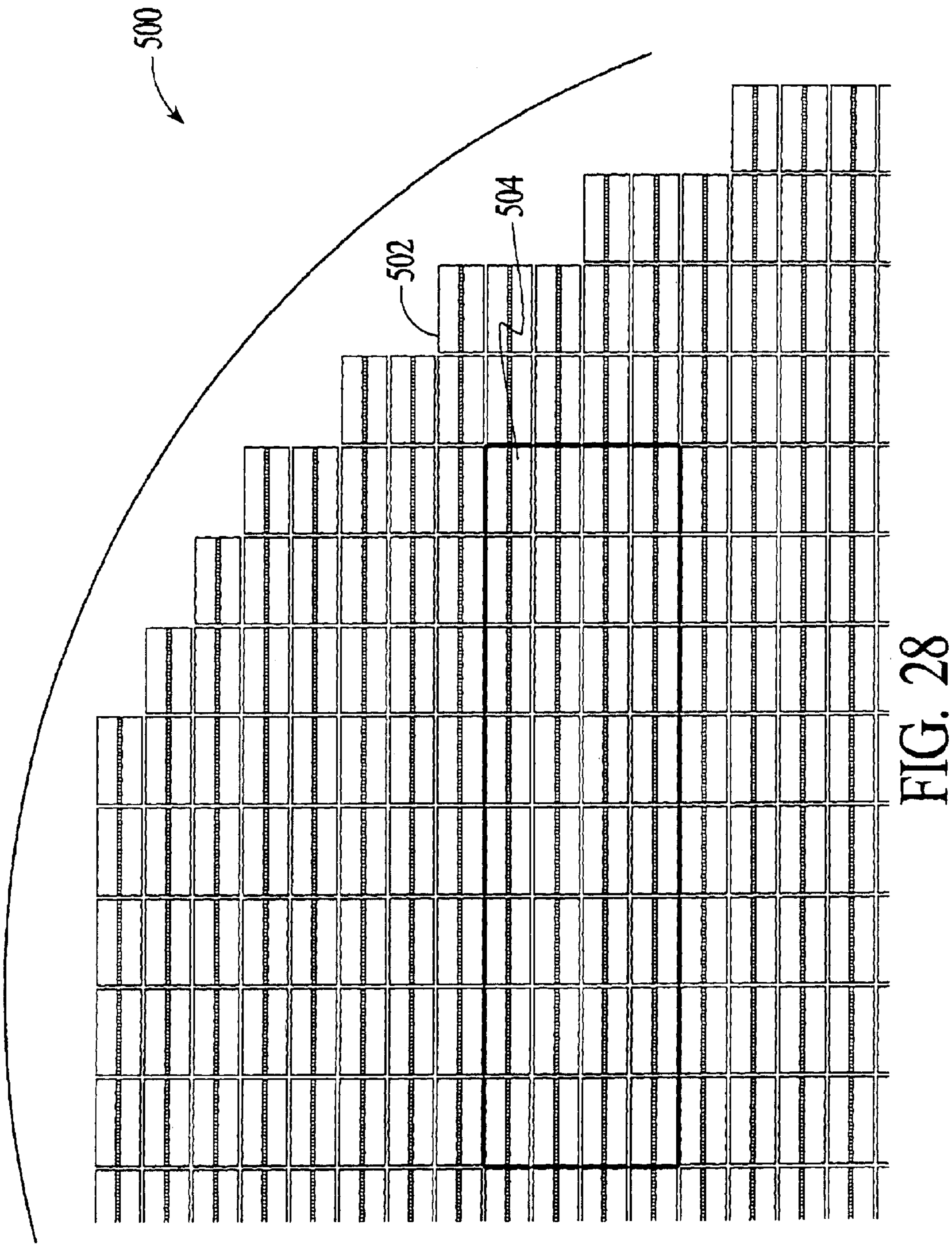

FIG. 27 illustrates an exemplary arrangement for such multi-site or array probing in accordance with preferred embodiments of the present invention. In such embodiments, multiple probe members are provided; in the illustrative embodiment, each side includes two probe members, lower probe member 482 and upper probe member 486, which may be manufacturing as described elsewhere herein. Each probe member includes a plurality of contact bumps 494 for contact to electronic devices formed on substrate 480.

As previously described, position of a suitable mechanical ground or support is important for proper stress sharing and/or compliance with deviations with planarity of the contact pads on the electronic devices. In the illustrative arrangement, first mechanical support 484 is provided between lower probe member 482 and upper probe member 486. Preferably, mechanical support 484 is glued or otherwise secured in a fixed manner to the two probe members. Mechanical support 484 provides support for lower probe member 482 when it is pushed into contact with the electronic devices. Mechanical support 488 is provided above upper probe member 486 and is secured to an upper surface of upper probe member, again preferably with a glue or other adhesive in a fixed manner. Mechanical support 488 is coupled to PCB 490, preferably in a manner to be adjusted for alignment purposes. A three point adjustment or four point adjustment mechanism preferably is used to adjust primarily the planarity of the contact device, and in particular the planarity of the contacts of the probe member, with respect to the surface of substrate 480. The conductor runs on probe members 482 and 486 is electrically coupled to PCB 490 in the illustrated embodiments with flex circuits 492 or other suitable electrical connector arrangement.

In certain preferred embodiments, each of the probe members has one, two or perhaps more contact pads per finger (as described elsewhere herein), and preferably has fingers arranged in a line so as to probe multiple electronic devices, or multiple rows of contacts on one more devices (e.g., a type of array probing). The size and positioning and geometries of the probe members and mechanical support 484, as well as contact positions, may be selected so as to properly correspond with contact pads on the electronic devices.

As an illustrative example, such a contact device configuration may be used to probe an array of electronic devices on a wafer. As illustrated in FIG. 28, wafer 500 includes a number of electronic devices 502 arranged in a conventional matrix manner. Such devices may be, for example, dynamic random access memories or other memory or other semiconductor devices. In the illustrated arrangement, each electronic device 502 includes a single row of contact pads arranged down the center or in the interior of the electronic device (such as the LOC devices described elsewhere herein). With the arrangement of FIG. 27, fingers on each of the probe members may span eight or some other desired number of electronic devices. With each probe member contacting one row of electronic devices, a four by eight array of electronic devices may be simultaneously probed with the contact device.

As will be understood, other arrangements of electronic devices may be probed with such a configuration, such as a four by four or other array, and also it may be used to probe an array of contacts on a single electronic device, or an array of contacts on a row or other multiple arrangement of electronic devices, etc.

A further preferred embodiment of a contact device incorporating external impedances or other components on the probe member will now be described with reference to FIG. 29.

Figure 29:
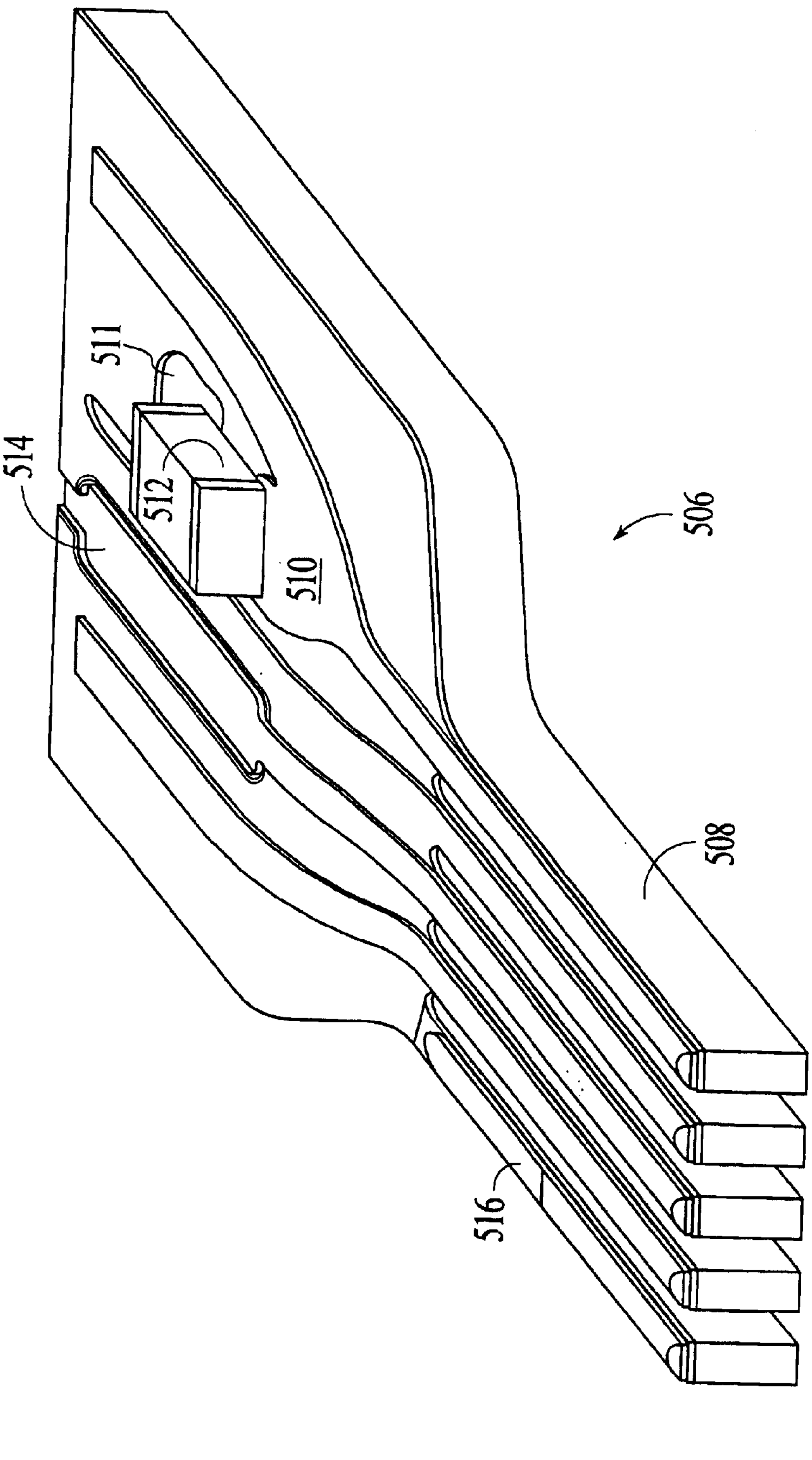
FIG. 29 illustrates a probe member having external components or impedances formed on the probe member.

As illustrated in FIG. 29, probe member 506 includes a number of fingers 508, which may be formed in a manner as described elsewhere herein. Conductor run 510 extends back from the tip portion of the fingers, and the conductor runs of probe member 506 are mapped to spread out so that component 512 may be electrically coupled to conductor run 510. Component 512 may be, for example, a decoupling capacitor with a first end coupled to a power supply line, and with a second end coupled to the grounded substrate through via 511. As an additional example, the conductor runs may be mapped to provide an area for component 514 to be formed directly onto the substrate of the probe member. As an additional example, component 514 may be a planar capacitor formed with a thinner dielectric formed between the grounded substrate and an upper plate of the capacitor. As one additional component, a short to the grounded substrate may be formed by via 516 at a position on or near one or more of fingers 508.

Resistive or inductive elements may similarly be formed on probe member 506, with proper mapping of the conductor runs to provide a suitable area for the component, and proper fabrication steps. Certain simple external circuits similarly may be formed on the probe members, such as a filter or other circuit as may be desired for the particular electronic devices.

It will be appreciated that the invention is not restricted to the particular embodiment that has been described, and that variations may be made therein without departing from the scope of the invention as defined in the appended claims and equivalents thereof. For example, although the invention has been described with reference to the drawings in terms of strip line and microstrip transmission line environments, if the film 14 were omitted and every other conductor run 26 across the contact device were a ground conductor run, a combination of a microstrip and coplanar transmission line environment would be provided. If every other conductor run were not a ground run, a microstrip transmission line environment would be provided as far as the forward edge of the layer 44, and for some applications, it might be acceptable for the transmission line environment to terminate at this point, provided that it is quite close to the contact bumps. Application of the invention to a semiconductor tester has been described with reference to an implementation in which there is one contact bump on each finger of the contact device, and the use of individual fingers for each contact bump ensures maximum accommodation of non-coplanarity of the contact pads of the DUT. However, it might be advantageous to provide two contact bumps, each connected to its own conductor run, since torsion of the finger accommodates a difference in height of the respective contact pads, and the greater width of the finger provides substantially greater stiffness with respect to deflection. The invention is not limited to testing of devices prior to packaging and may he used for final testing of packaged devices, particularly a device that is packaged for surface mounting, since the terminals are then suitably positioned for engagement by the contact bumps. Further, numerical references, while giving unexpectedly desirable results in the preferred embodiments over prior art techniques, may be adjusted in other embodiments.

Various embodiments are disclosed for illustrative purposes, which may be utilized to produce contact devices for testing a variety of electronic devices, and for producing electronic devices utilizing such contact devices.

What is claimed is:

1. A method for manufacturing an electronic device, comprising the steps of:

generating a design description of the electronic device using a computer aided design tool;

electronically determining physical device data representing a physical description of the electronic device based on the design description, wherein the physical device data includes data defining connection points for connecting the electronic device to external circuits, wherein the physical device data include data identifying a plurality of connection points of the electronic device, wherein the connection points include at least a first connection point that is used for testing of the electronic device and also for electrical connection to the electronic device during operation of the electronic device and at least a second connection point that is used only for testing of the electronic device, wherein the second connection point has a physical dimension that is smaller than a corresponding physical dimension of the first connection point;

producing a physical embodiment of the electronic device in accordance with the physical device data;

electronically determining physical test member data representing conductors and contact points of a test member for testing the electronic device, wherein the step of electronically determining physical test member data includes determining at least a portion of a physical layout of conductors and contact points of the test member based on the data identifying the plurality of connection points of the electronic device;

producing the test member in accordance with the test member data;

engaging the test member with the electronic device, wherein contact points of the test member engage connection points of the electronic device, wherein stimulus and response instruments apply test signals to the electronic device through the test member and receive signals from the electronic device, wherein the stimulus and response instruments determine whether the electronic device is defective.

2. The method of claim 1, wherein a first conductor is determined to have a first width, wherein a second conductor is determined to have a second width, wherein the first width is greater than the second width.

3. The method of claim 2, wherein the conductors include one or more third conductors, wherein the one or more third conductors are determined to have a third width.

4. The method of claim 3, wherein the third width is intermediate to the first and second widths.

5. The method of claim 1, wherein the width and spacing of the conductors are determined in accordance with signal data corresponding to the connection points.

6. The method of claim 5, wherein the width and spacing of the conductors are determined in an iterative manner depending upon the signal data.

7. The method of claim 5, wherein the width and spacing of the conductors are physically mapped in accordance with the signal data.

8. The method of claim 1, wherein the step of electronically determining physical test member data comprises generating data having a format, wherein the format includes one or more fields, wherein the one or more fields includes fields identifying each of the contact points of the test member, physical position data for each of the contact points of the test member, and/or electrical or physical characteristics data for each of the contact points of the test member.

9. The method of claim 1, wherein the physical test member data are generated as a result of options selected by a user during the step of generating the design description of the electronic device.

10. The method of claim 1, wherein the physical test member data include data corresponding to an external impedance to be coupled to one or more of the contact points of the test member, wherein the conductors of the physical test member are physically arranged to provide an area for coupling of the external impedance.

11. The method of claim 10, wherein the external impedance comprises a capacitor.

12. The method of claim 1, wherein the test member is produced using a photolithographic process.

13. The method of claim 12, wherein the photolithographic process utilizes a mask generated from the physical test member data.

14. The method of claim 1, wherein the electronic device comprises an integrated circuit or display device.

15. The method of claim 1, wherein the electronic device comprises a semiconductor device.

16. The method of claim 15, wherein the semiconductor device comprises a memory device.

17. The method of claim 15, wherein the semiconductor device comprises a lead on chip (LOC) semiconductor device.

18. The method of claim 1, wherein physical characteristics of one or more of the conductors carrying power supply signals are different from physical characteristics of one or more of the conductors carrying varying signals.

19. The method of claim 1, wherein physical characteristics of one or more of the conductors carrying higher frequency signals are different from physical characteristics of one or more of the conductors carrying lower frequency signals.

20. The method of claim 1, wherein the test member comprises a membrane test member.

21. The method of claim 20, wherein the membrane test member comprises a membrane having conductors and contact points.

22. The method of claim 20, wherein the membrane is pulled over an elastomer or truncated pyramid.

23. The method of claim 1, wherein the test member comprises microsprings.

24. The method of claim 1, wherein the test member comprises a probe member having a proximal end and a distal end, wherein the probe member comprises a substrate having fingers projecting from the distal end of the probe member along an axis, wherein the fingers have conductors and contact points formed thereon for connection with the connection points of the electronic device.

25. The method of claim 1, wherein the test member includes one or more rows of contact points.

26. The method of claim 25, wherein the electronic device comprises a lead on chip (LOC) semiconductor device.

27. The method of claim 1, wherein data corresponding to a physical layout of the electronic device is electronically produced, wherein data corresponding to a physical layout of the test member is electronically produced, wherein physical coordinate data corresponding to connection points of the electronic device are not manually entered into a software tool in order to produce the data corresponding to a physical layout of the test member.

* * * * *